(12) United States Patent
Kim et al.

(10) Patent No.: US 12,396,104 B2
(45) Date of Patent: Aug. 19, 2025

(54) RELEASE FILM

(71) Applicant: Samsung Display Co., Ltd., Yongin-si (KR)

(72) Inventors: Hun-Tae Kim, Seoul (KR); Gyumdong Bae, Cheonan-si (KR); Dongho Yoon, Anyang-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 607 days.

(21) Appl. No.: 17/686,946

(22) Filed: Mar. 4, 2022

(65) Prior Publication Data

US 2022/0377908 A1  Nov. 24, 2022

(30) Foreign Application Priority Data

May 21, 2021 (KR) .................. 10-2021-0065754

(51) Int. Cl.
```
H05K 3/28      (2006.01)
H01L 25/18     (2023.01)
H05K 1/14      (2006.01)
H05K 1/18      (2006.01)
H10K 59/131    (2023.01)
H10K 59/80     (2023.01)
```

(52) U.S. Cl.
CPC ............ *H05K 3/281* (2013.01); *H05K 1/147* (2013.01); *H05K 1/189* (2013.01); *H05K 3/288* (2013.01); *H10K 59/871* (2023.02); *H01L 25/18* (2013.01); *H05K 2201/10128* (2013.01); *H05K 2203/304* (2013.01); *H10K 59/131* (2023.02); *H10K 59/873* (2023.02)

(58) Field of Classification Search
CPC ........ H05K 3/288; H05K 1/147; H05K 1/189; H05K 3/281; H05K 2201/10128; H05K 2203/304; H01L 25/18; H10K 59/131; H10K 59/871; H10K 59/873; H10K 77/111; H10K 2102/311; B65D 65/04; B65D 65/22; B65D 85/70; B65D 2585/86; C09J 7/403; C09J 9/02; C09J 2203/326; C09J 2301/124; H01R 12/771; H04M 1/0266; H04M 1/0274; H04M 1/0277

See application file for complete search history.

(56) References Cited

U.S. PATENT DOCUMENTS

2020/0254721 A1* 8/2020 Lee .................. B32B 19/04
2020/0267839 A1  8/2020 Woo et al.

FOREIGN PATENT DOCUMENTS

KR   1020170000621 A   1/2017
KR   1020190042399 A   4/2019
KR   1020200101201 A   8/2020

\* cited by examiner

*Primary Examiner* — Patricia L. Nordmeyer
(74) *Attorney, Agent, or Firm* — CANTOR COLBURN LLP

(57) ABSTRACT

A release film on a printed circuit board and a connector connected to the printed circuit board includes a first release film disposed on a first surface of the printed circuit board and a surface of the connector, a second release film disposed on a second surface of the printed circuit board opposite to the first surface of the printed circuit board, and a first adhesive attached to a portion of a surface of the first release film that does not overlap the second release film, extending towards the second release film and covering a portion of a surface of the second release film that does not face the first release film.

21 Claims, 20 Drawing Sheets

FIG. 7A
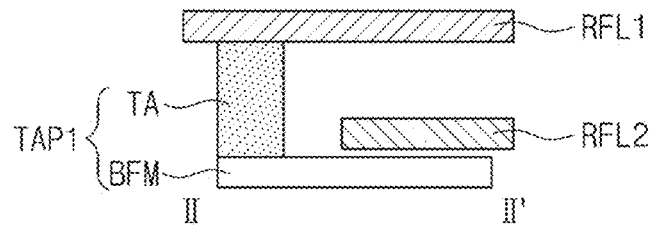
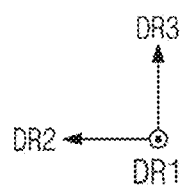
FIG. 7B
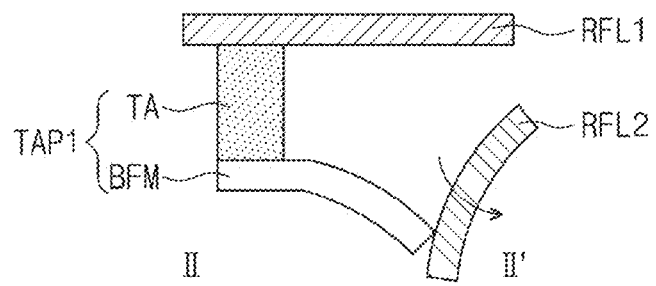
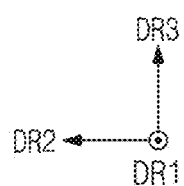

FIG. 8A
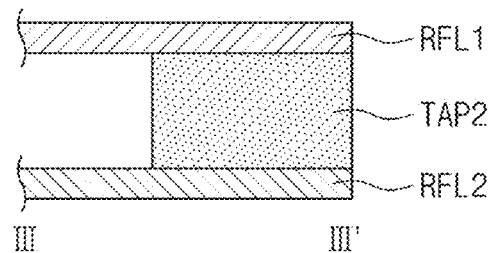
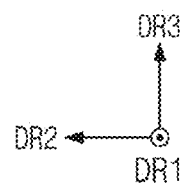
FIG. 8B
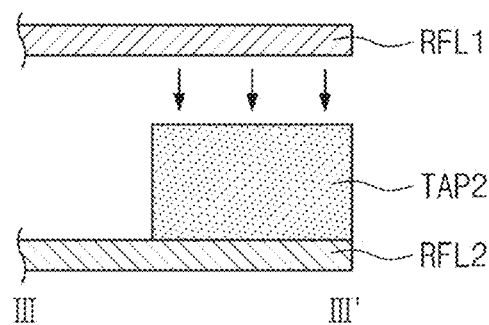
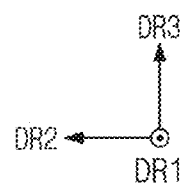

RELEASE FILM

This application claims priority to Korean Patent Application No. 10-2021-0065754, filed on May 21, 2021, and all the benefits accruing therefrom under 35 U.S.C. § 119, the content of which in its entirety is herein incorporated by reference.

BACKGROUND

1. Field

Embodiments of the invention herein relate to a release film.

2. Description of the Related Art

In general, display devices include display modules for displaying images, supports for supporting the display modules, and printed circuit boards connected to the display modules. The supports are more rigid than the display modules, and support the display modules. The printed circuit boards provide driving signals for driving the display modules to the display modules. The display modules may be driven by the printed circuit boards to display images.

The printed circuit boards may be separately manufactured and then connected to the display modules. Pads of the printed circuit boards may be connected to pads of the display modules, and the printed circuit boards may thus be connected to the display modules. When the separately manufactured printed circuit boards are transferred to process chambers to be connected to the display modules, components to protect the printed circuit boards are desired.

SUMMARY

Embodiments of the invention provides a release film capable of protecting and transporting a printed circuit board more safely.

An embodiment of the invention provides a release film on a printed circuit board and a connector connected to the printed circuit board, the release film. The release film includes a first release film disposed on a first surface of the printed circuit board and a surface of the connector, a second release film disposed on a second surface of the printed circuit board opposite to the first surface of the printed circuit board, and a first adhesive attached to a portion of a surface of the first release film that does not overlap the second release film, and extending towards the second release film and covering a portion of a surface of the second release film that does not face the first release film.

In an embodiment of the invention, a release film disposed on a printed circuit board and a connector connected to the printed circuit board includes a first release film disposed on a first surface of the printed circuit board and a surface of the connector, and defining a first opening and a second opening adjacent to the first opening, a second release film disposed below the printed circuit board, and a first adhesive attached to a portion of the first release film that does not overlap the second release film, and extending towards the second release film and covering a portion of a surface of the second release film that does not face the first release film. The first opening exposes a connection portion of the printed circuit board and a first connection portion of the connector connected to the connection portion.

In an embodiment of the invention, a release film disposed on a printed circuit board connected to a display module includes a first release film disposed on a first surface of the printed circuit board connected to a display module and disposed on a surface of the display module facing the printed circuit board, and a connector connected to the printed circuit board, and defining a first opening and a second opening adjacent to the first opening, and a first adhesive attached to a portion of the first release film. The first adhesive includes a double-sided adhesive attached to the portion of the first release film, and a base film attached to one side of the double-sided adhesive that does not face the first release film. The first opening exposes a connection portion of the printed circuit board and a first connection portion of the connector connected to the connection portion.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings:

FIGS. 7A and 7B are cross-sectional views of line II-II' shown in FIG. 4;

FIGS. 8A and 8B are cross-sectional views of line III-III' shown in FIG. 4;

DETAILED DESCRIPTION

Figure 1:
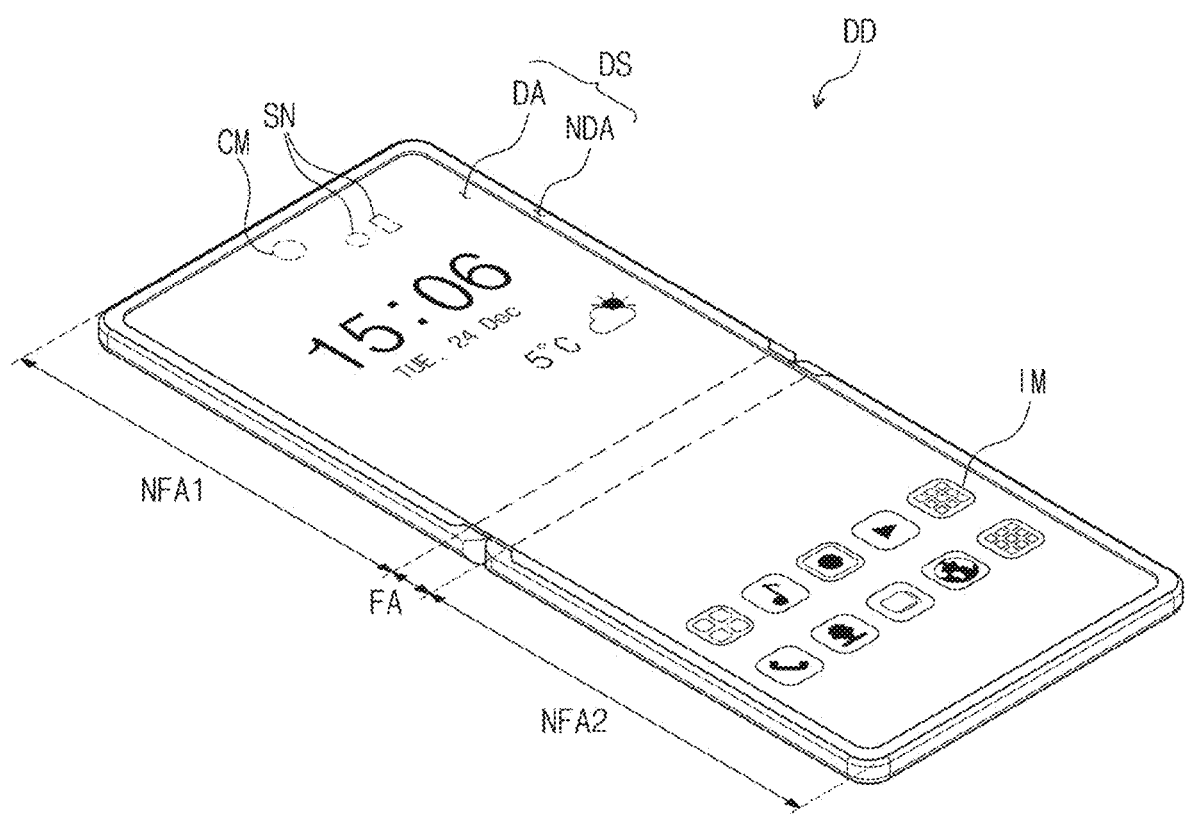
FIG. 1 is a perspective view of an embodiment of a display device manufactured using a printed circuit board protected through a release film according to the invention.

In the description, when an element (or a region, a layer, a portion, etc.) is referred to as being "on," "connected to,"

or "coupled to" another element, it means that the element may be directly disposed on/connected to/coupled to the other element, or that a third element may be disposed therebetween.

Like reference numerals refer to like elements. Also, in the drawings, the thickness, the ratio, and the dimensions of elements are exaggerated for an effective description of technical contents.

The term "and/or," includes all combinations of one or more of which associated configurations may define.

It will be understood that, although the terms "first", "second", etc. may be used herein to describe various elements, these elements should not be limited by these terms. These terms are only used to distinguish one element from another. A first element could be termed a second element, and, similarly, a second element could be termed a first element, for example, without departing from the scope of embodiments of the invention. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which the inventive concept pertains. It is also to be understood that terms defined in commonly used dictionaries should be interpreted as having meanings consistent with the meanings in the context of the related art, and are expressly defined herein unless they are interpreted in an ideal or overly formal sense.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, embodiments of the invention will be described with reference to the accompanying drawings.

Figure 2:
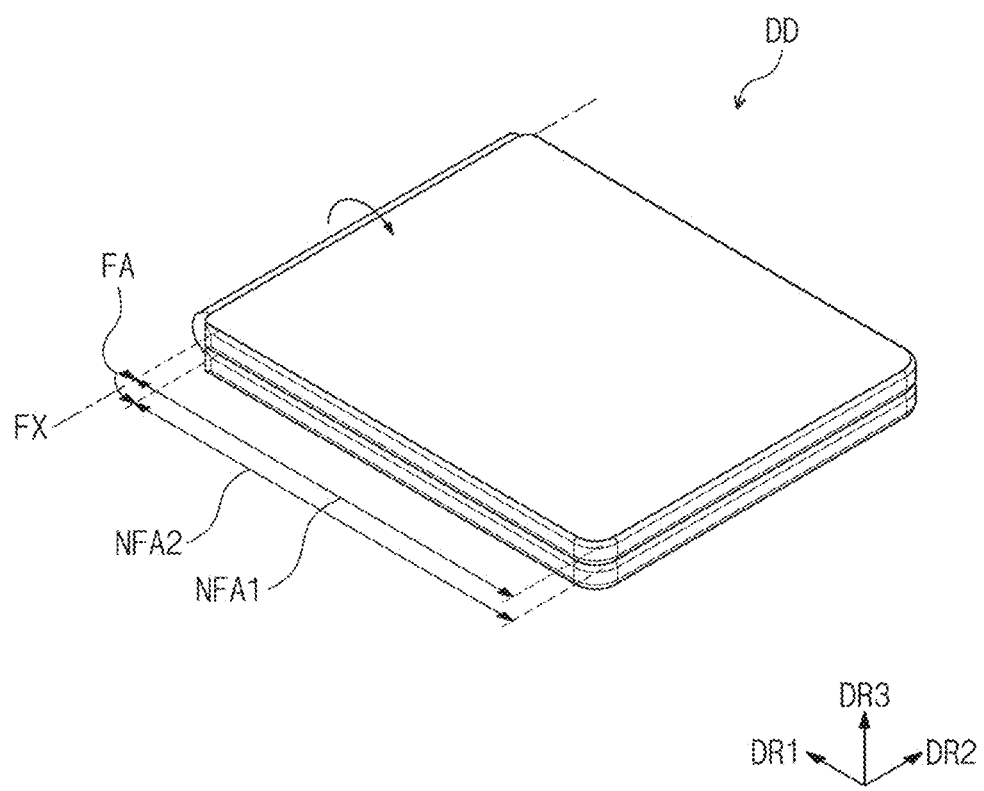
FIG. 2 is a view illustrating the display device shown in FIG. 1 in a folded state.

FIG. 1 is a perspective view of an embodiment of a display device manufactured using a printed circuit board protected through a release film according to the invention. FIG. 2 is a view illustrating the display device shown in FIG. 1 in a folded state.

Referring to FIG. 1, a display device DD in an embodiment of the invention may have a quadrangular (e.g., rectangular) shape which has long sides extending in a first direction DR1 and has short sides extending in a second direction DR2 crossing the first direction DR1. However, the invention is not limited thereto, and the display device DD may have various shapes such as a circular shape and a polygonal shape in other embodiments. The display device DD may be a flexible display device.

Hereinafter, a direction substantially perpendicularly crossing a plane defined by the first direction DR1 and the second direction DR2 is defined as a third direction DR3. In addition, in the description, "in a plan view" may be defined as a state viewed in the third direction DR3. In addition, in the description, "overlap" may refer to a state in which components are disposed overlapping each other in a plan view.

The display device DD may include a folding region FA and a plurality of non-folding regions NFA1 and NFA2. The non-folding regions NFA1 and NFA2 may include a first non-folding region NFA1 and a second non-folding region NFA2. The folding region FA may be disposed between the first non-folding region NFA1 and the second non-folding region NFA2. The first non-folding region NFA1, the folding region FA, and the second non-folding region NFA2 may be arranged in the first direction DR1.

In an embodiment, one folding region FA and two non-folding regions NFA1 and NFA2 are shown, but the number of the folding region FA and the non-folding regions NFA1 and NFA2 is not limited thereto. In an embodiment, the display device DD may include a plurality of non-folding regions, which is more than two, and a plurality of folding regions disposed between non-folding regions, for example.

An upper surface of the display device DD may be defined as a display surface DS, and may have a plane defined by the first direction DR1 and the second direction DR2. Images IM generated in the display device DD may be provided to users through the display surface DS.

The display surface DS may include a display region DA and a non-display region NDA around the display region DA. The display region DA may display images, and the non-display region NDA may not display images. The non-display region NDA surrounds the display region DA, and may define an edge of the display device DD printed in a predetermined color.

The display device DD may include a plurality of sensors SN and at least one camera CM. The sensors SN and the camera CM may be adjacent to the edge of display device DD. The sensors SN and the camera CM may be disposed in the display region DA adjacent to the non-display region NDA. The sensors SN and the camera CM may be disposed in the first non-folding region NFA1, but the disposition position of the sensors SN and the camera CM is not limited thereto.

In an embodiment, the sensors SN may be near-illumination sensors, but the type of the sensors SN is not limited thereto. The camera CM may capture external images.

Referring to FIG. 2, the display device DD may be a foldable display device DD which is folded or unfolded. In an embodiment, the folding region FA may be bent with respect to a folding axis FX parallel to the second direction DR2, for example, so that the display device DD may be folded. The folding axis FX may be defined as a minor axis parallel to a short side of the display device DD.

When the display device DD is folded, the first non-folding region NFA1 and the second non-folding region NFA2 face each other, and the display device DD may be in-folded such that the display surface DS is not exposed to the outside. However, the invention is not limited thereto. In an embodiment, the display device DD may be out-folded around the folding axis FX such that the display surface DS is exposed to the outside, for example.

Figure 3:
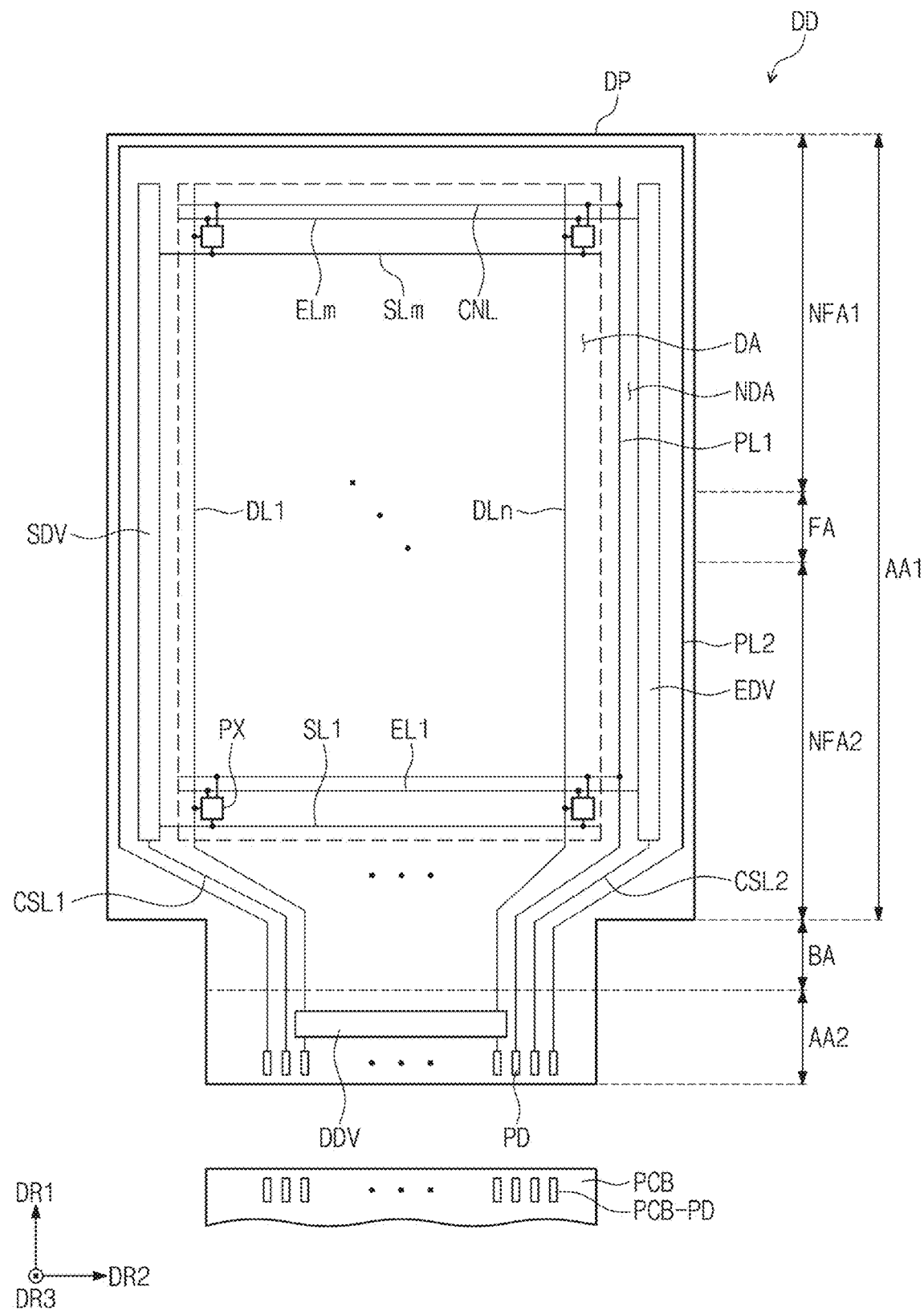
FIG. 3 is a plan view of the display device shown in FIG. 1.

FIG. 3 is a plan view of the display device shown in FIG. 1.

Referring to FIG. 3, the display device DD may include a display panel DP, a scan driver SDV, a data driver DDV, and an emission driver EDV.

The display panel DP in an embodiment of the invention may be an emission display panel, and is not particularly limited. In an embodiment, the display panel DP may be an organic emission display panel or an inorganic emission display panel, for example. An emission layer of the organic emission display panel may include organic emission materials. An emission layer of the inorganic emission display panel may include quantum dots, quantum rods, etc. Hereinafter, the display panel DP will be described as an organic emission display panel.

The display panel DP may be a flexible display panel. In an embodiment, the display panel DP may include a plurality of electronic elements disposed on a flexible substrate, for example. The display panel DP may extend more in the first direction DR1 than in the second direction DR2. The display panel DP may have a plane defined by the first and second directions DR1 and DR2.

The display panel DP may include a first region AA1, a second region AA2, and a bending region BA disposed between the first region AA1 and the second region AA2. The bending region BA may extend in the second direction DR2, and the first region AA1, the bending region BA, and the second region AA2 may be arranged in the first direction DR1.

The first region AA1 may extend in the first direction DR1, and may have long sides opposite to each other in the second direction DR2. The length of the bending region BA and the length of the second region AA2 may be smaller than the length of the first region AA1 based on the second direction DR2.

The first region AA1 may include the display region DA and the non-display region NDA around the display region DA. The non-display region NDA may surround the display region DA. The display region DA may be a region which displays images, and the non-display region NDA may be a region which does not display images. The second region AA2 and the bending region BA may be regions which do not display images.

The first region AA1 may include, when viewed in the second direction DR2, the first non-folding region NFA1, the second non-folding region NFA2, and the folding region FA between the first non-folding region NFA1 and the second non-folding region NFA2.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, a first power line PL1, a second power line PL2, a plurality of connection lines CNL, and a plurality of pads PD. Here, m and n are natural numbers. The pixels PX are disposed in the display region DA, and may be connected to the scan lines SL1 to SLm, the data lines DL1 to DLn, and the emission lines EL1 to ELm.

The scan driver SDV and the emission driver EDV may be disposed in the non-display region NDA. The scan driver SDV and the emission driver EDV may be disposed in the non-display region NDA adjacent to each of the long sides (e.g., left and right sides in FIG. 3) of the first region AA1. The data driver DDV may be disposed in the second region AA2. The data driver DDV may be manufactured in the form of an integrated circuit chip and disposed (e.g., mounted) on the second region AA2.

The scan lines SL1 to SLm may extend in the second direction DR2 and connected to the scan driver SDV. The data lines DL1 to DLn are extended in the first direction DR1, and may be connected to the data driver DDV via the bending region BA. The emission lines EL1 to ELm may extend in the second direction DR2 and connected to the emission driver EDV.

The first power line PL1 may extend in the first direction DR1 and disposed in the non-display region NDA. The first power line PL1 may be disposed between the display region DA and the emission driver EDV. However, the invention is not limited thereto, and the first power line PL1 may be disposed between the display region DA and the scan driver SDV.

The first power line PL1 may extend in the second region AA2 via the bending region BA. In a plan view, the first power line PL1 may extend towards a lower end of the second region AA2. The first power line PL1 may have a first voltage.

The second power line PL2 may be disposed in the non-display region NDA adjacent to the long sides of the first region AA1, and in the non-display region NDA facing the second region AA2 with the display region DA therebetween. The second power line PL2 may be disposed farther outside than the scan driver SDV and the emission driver EDV.

The second power line PL2 may extend to the second region AA2 via the bending region BA. The second power line PL2 may extend in the first direction DR1 in the second region AA2 with the data driver DDV therebetween. In a plan view, the second power line PL2 may extend towards the lower end of the second region AA2.

The second power line PL2 may receive a second voltage having a lower level than that of the first voltage. For convenience of description, the connection relationship is not shown, but the second power line PL2 extends to the display region DA and connected to the pixels PX, and the second voltage may be provided to the pixels PX through the second power line PL2.

The connection lines CNL may extend in the second direction DR2 and arranged in the first direction DR1. The connection lines CNL may be connected to the first power line PL1 and the pixels PX. The first voltage may be applied to the pixels PX through the first power line PL1 and the connection lines CNL connected to each other.

The first control line CSL1 is connected to the scan driver SDV, and may extend towards the lower end of the second region AA2 via the bending region BA. The second control line CSL2 is connected to the emission driver EDV, and may extend towards the lower end of the second region AA2 via the bending region BA. The data driver DDV may be disposed between the first control line CSL1 and the second control line CSL2.

In a plan view, the pads PD may be disposed adjacent to the lower end of the second region AA2. The data driver DDV, the first power line PL1, the second power line PL2, the first control line CSL1, and the second control line CSL2 may be connected to the pads PD.

The data lines DL1 to DLn may be connected to corresponding pads PD through the data driver DDV. In an embodiment, the data lines DL1 to DLn may be connected to the data driver DDV, and the data driver DDV may be connected to the pads PD respectively corresponding to the data lines DL1 to DLn, for example.

The display device DD may include a printed circuit board PCB connected to the pads PD. Connection pads PCB-PD are disposed on the printed circuit board PCB, and the connection pads PCB-PD may be connected to the pads PD.

On the printed circuit board PCB, a timing controller (not shown) may be disposed. The timing controller may be connected to the pads PD through the printed circuit board. The timing diagram may control the operation of the scan driver SDV, the data driver DDV, and the emission driver EDV. The timing controller may generate a scan control signal, a data control signal, and an emission control signal in response to control signals received from the outside.

The scan control signal may be provided to the scan driver SDV through the first control line CSL1. The emission control signal may be provided to the emission driver EDV through the second control line CSL2. The data control signal may be provided to the data driver DDV. The timing controller receives image signals from the outside, and may convert the data format of the image signals to match interface specifications with the data driver DDV and provide the image signals with converted data format to the data driver DDV.

The scan driver SDV may generate a plurality of scan signals in response to the scan control signal. The scan signals may be applied to the pixels PX through the scan lines SL1 to SLm. The scan signals may be sequentially applied to the pixels PX.

The data driver DDV may generate a plurality of data voltages corresponding the image signals in response to the data control signal. The data voltages may be applied to the pixels PX through the data lines DL1 to DLn. The emission driver EDV may generate a plurality of emission signals in response to the emission control signal. The emission signals may be applied to the pixels PX through the emission lines EL1 to ELm.

The pixels PX may be provided with the data voltages in response to the scan signals. The pixels PX may display an image by emitting light of luminance corresponding to the data voltages in response to the emission signals. The emission duration of the pixels PX may be controlled by the emission signals.

On the printed circuit board PCB, a voltage generator (not shown) may be disposed. The voltage generator may be connected to the pads PD through the printed circuit board. The voltage generator may generate the first voltage and the second voltage. The first voltage and the second voltage may respectively be applied to the first power line PL1 and the second power line PL2. The printed circuit board PCB may be protected through a release film and transported. The configuration will be described in detail later.

Each of the pixels PX may include an organic emission element. The first voltage may be applied to an anode of the organic emission element, and the second voltage may be applied to a cathode of the organic emission element. The organic emission element may be operated by being applied with the first voltage and the second voltage.

Figure 4:
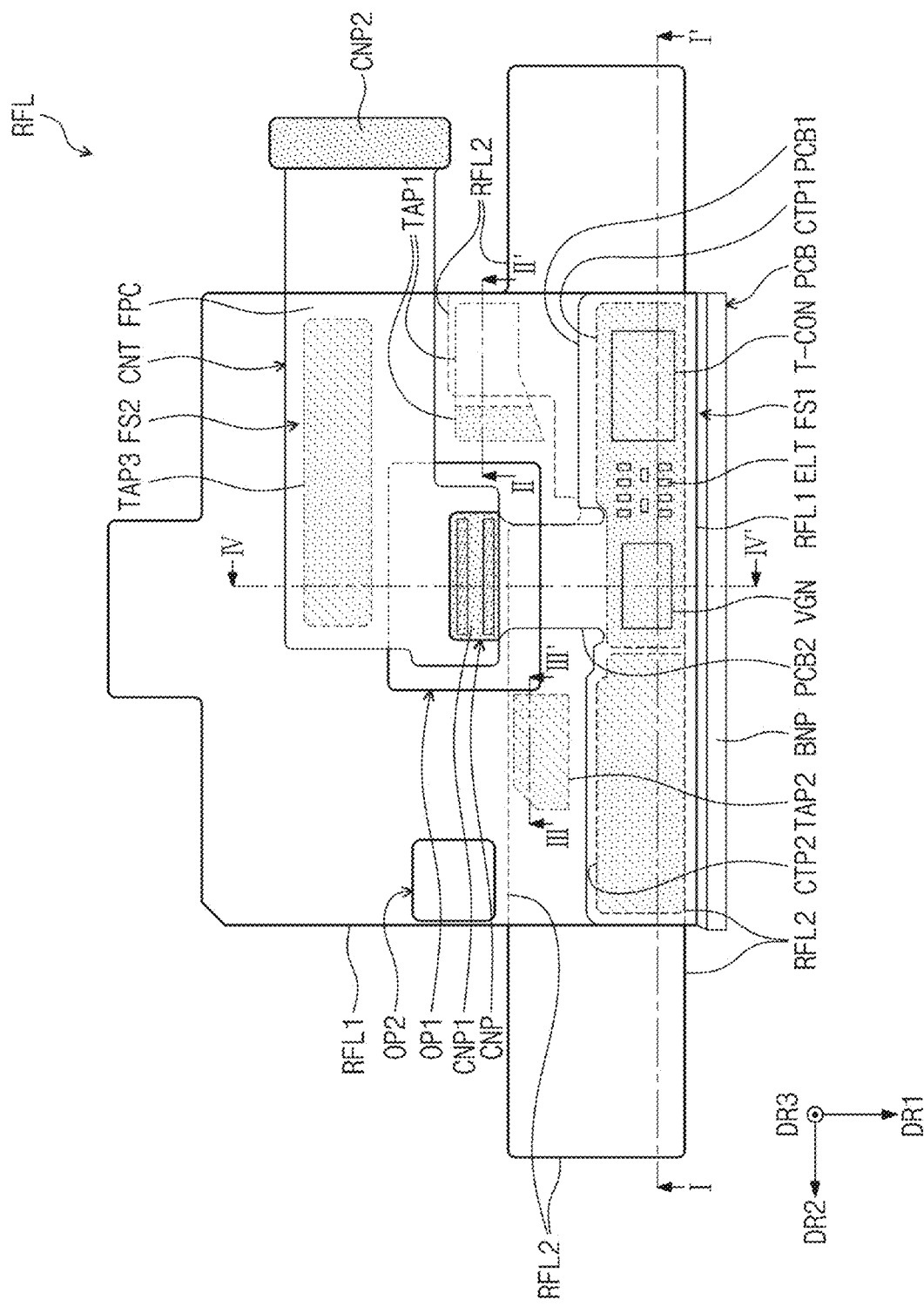
FIGS. 4 and 5 are plan views of an embodiment of a release film and a printed circuit board protected through the release film according to the invention.
Figure 5:
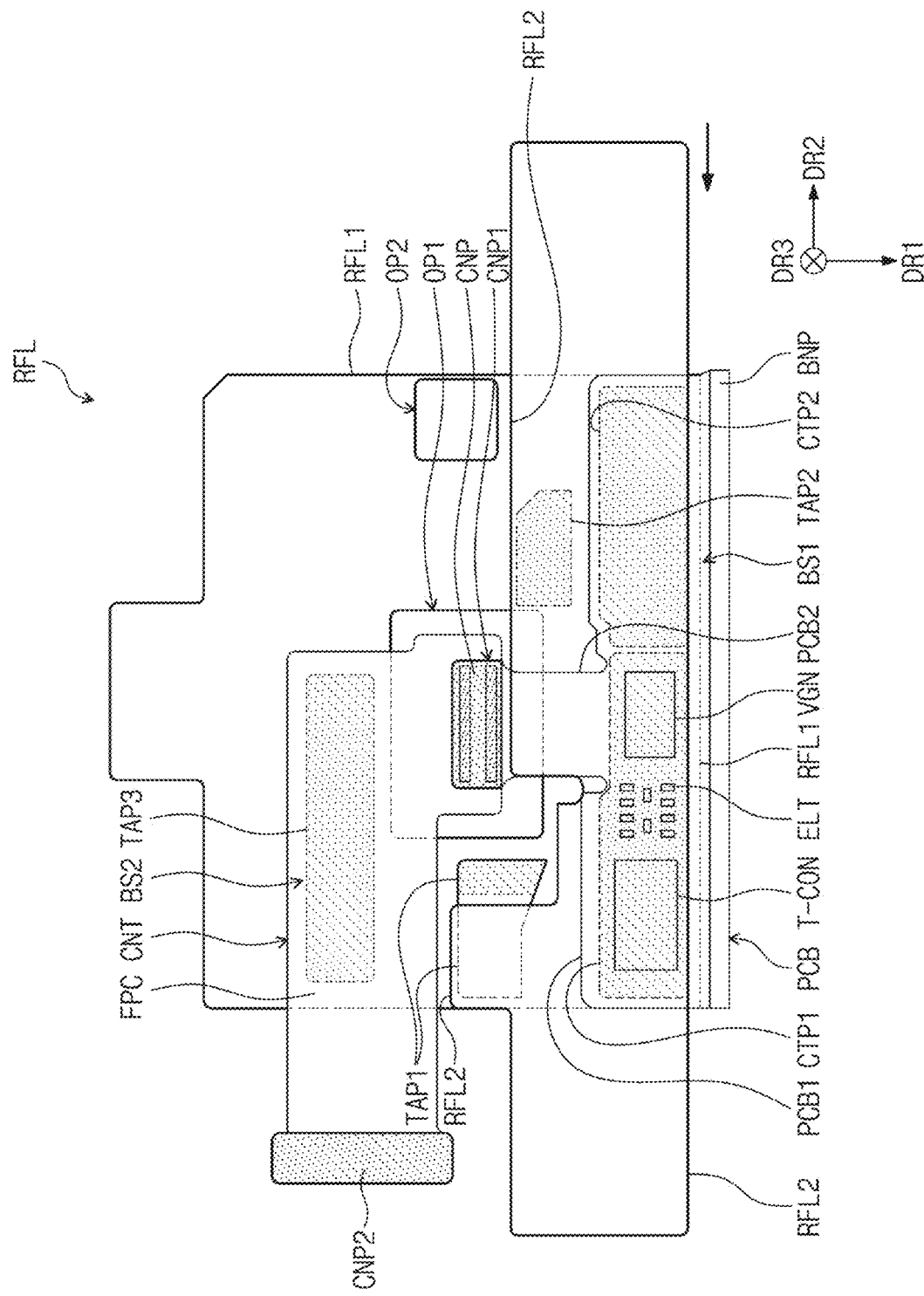

FIGS. 4 and 5 are plan views of an embodiment of a release film and a printed circuit board protected through the release film according to the invention.

FIG. 4 is a view illustrating a front surface of the printed circuit board PCB, and FIG. 5 is a view illustrating a rear surface of the printed circuit board PCB.

In an embodiment, in FIGS. 4 and 5, a printed circuit board PCB, a connector CNT, a timing controller T-CON, a voltage generator VGN, and a plurality of elements ELT are shown using solid lines. In components other than the components above, in a plan view, portions that are disposed relatively lower and covered are shown using dotted lines.

Referring to FIGS. 4 and 5, the printed circuit board PCB may include a front surface FS1 (refer to FIG. 6) and a rear surface BS1 opposite to each other in the third direction DR3. The front surface FS1 and the rear surface BS1 may each have a plane defined by the first and second directions DR1 and DR2.

The connector CNT may be connected to the printed circuit board PCB. The connector CNT may include a front surface FS2 and a rear surface BS2 opposite to each other in the third direction DR3. The front surface FS2 and the rear surface BS2 may each have a plane defined by the first and second directions DR1 and DR2.

The printed circuit board PCB may include, in a plan view defined by the first and second directions DR1 and DR2, a first substrate portion PCB1, a second substrate portion PCB2, a connection portion CNP, and a bonding portion BNP.

The first substrate portion PCB1 may extend in the second direction DR2. The second substrate portion PCB2 may extend from a portion of the first substrate portion PCB1 in the first direction DR1. The second substrate portion PCB2 may extend from one side (e.g., upper side in FIG. 4) of the first substrate portion PCB1 out of opposite sides (e.g., upper and lower sides in FIG. 4) of the first substrate portion PCB1 opposite to each other in the first direction DR1. The connection portion CNP may be connected to one side (e.g., upper side in FIG. 4) of the second substrate portion PCB2 facing the first direction DR1.

The bonding portion BNP may be adjacent to the other side (e.g., lower side in FIG. 4) of the first substrate portion PCB1 out of the opposite sides of the first substrate portion PCB1 opposite to each other in the first direction DR1. The first substrate portion PCB1 may be disposed between the bonding portion BNP and the second substrate portion PCB2. The bonding portion BNP may extend in the second direction DR2. Connection pads PCB-PD of the printed circuit board PCB shown in FIG. 3 may be disposed on the bonding portion BNP.

As shown in FIG. 3, one side (e.g., upper side in FIG. 3) of the printed circuit board PCB on which the connection pads PCB-PD are disposed may face the display panel DP, and may thus be adjacent to the display panel DP. The bonding portion BNP may be defined as a portion of the printed circuit board PCB adjacent to the display panel DP. The bonding portion BNP may be defined as a portion of the printed circuit board PCB adjacent to the one side of the printed circuit board PCB.

The connector CNT may include a flexible circuit film FPC, a first connection portion CNP1, and a second connection portion CNP2. The flexible circuit film FPC may extend in the second direction DR2. The first connection portion CNP1 may be connected to one side (e.g., left side in FIG. 4) of the flexible circuit film FPC. The second connection portion CNP2 may be connected to the other side (e.g., right side in FIG. 4) of the flexible circuit film FPC out of the opposite sides (e.g., left and right sides in FIG. 4) of the flexible circuit film FPC.

The first connection portion CNP1 may be disposed on the connection portion CNP of the printed circuit board PCB, and overlap the connection portion CNP. The first connection portion CNP1 may be connected to the connection portion CNP. The first connection portion CNP1 is connected to the connection portion CNP, and accordingly, the connector CNT may be connected to the printed circuit board PCB.

Hereinafter, when the front surfaces FS1 and FS2 are viewed in FIG. 4, structures disposed above the front surfaces FS1 and FS2 are expressed as "structures disposed on the front surfaces FS1 and FS2". When the rear surfaces BS1 and BS2 are viewed in FIG. 5, structures disposed above the rear surfaces BS1 and BS2 are expressed as "structures disposed below the rear surfaces BS1 and BS2". That is, assuming that the front surfaces FS1 and FS2 face the upper direction, and the rear surfaces BS1 and BS2 face the lower direction based on the third direction DR3, the vertical arrangement relationship of the components will be described in FIGS. 4 and 5. In addition, in the description, "on a front surface of a structure" may indicate "on a structure", and "below a rear surface of a structure" may indicate "below a structure".

The timing controller T-CON, the voltage generator VGN, and the plurality of elements ELT may be disposed on the front surface FS1 of the printed circuit board PCB. In an embodiment, the elements ELT may include elements such as resistors and capacitors. The timing controller T-CON, the voltage generator VGN, and the elements ELT may be defined as components.

A first conductive adhesive CTP1 and a second conductive adhesive CTP2 may be disposed below the rear surface BS1 of the printed circuit board PCB. In an embodiment, the first and second conductive adhesives CTP1 and CTP2 may have a form of a tape, but the invention is not limited thereto. The first conductive adhesive CTP1 and the second conductive adhesive CTP2 may extend in the second direction DR2, and may be arranged in the second direction DR2. The first conductive adhesive CTP1 and the second conductive adhesive CTP2 may overlap the first substrate portion PCB1.

The timing controller T-CON, the voltage generator VGN, and the elements ELT may overlap the first conductive adhesive CTP1. The first conductive adhesive CTP1 and the second conductive adhesive CTP2 may include conductive materials. Although not shown, the first conductive adhesive CTP1 and the second conductive adhesive CTP2 may be connected to a ground layer disposed in the printed circuit board PCB. The first conductive adhesive CTP1 and the second conductive adhesive CTP2 may induce external static electricity to the ground, thereby discharging the static electricity.

The release film RFL may cover the front surface FS1 and the rear surface BS1 of the printed circuit board PCB to protect the printed circuit board PCB. In addition, the release film RFL covers the front surface FS2 of the connector CNT, and may thus protect the connector CNT.

The release film RFL may include a first release film RFL1, a second release film RFL2, a first adhesive TAP1, a second adhesive TAP2, and a third adhesive TAP3. In an embodiment, the first and second adhesives TAP1 and TAP2 may have a form of a tape, but the invention is not limited thereto. The first release film RFL1 may be disposed on the front surface FS1 of the printed circuit board PCB and the front surface FS2 of the connector CNT. The second release film RFL2 may be disposed below the rear surface BS1 of the printed circuit board PCB.

The first release film RFL1 may overlap the front surface FS1 of the printed circuit board PCB and the front surface FS2 of the connector CNT. The first release film RFL1 may overlap the first substrate portion PCB1 and the second substrate portion PCB2, and may not overlap the connection portion CNP and the bonding portion BNP. In a plan view, a first opening OP1 for exposing the connection portion CNP may be defined in the first release film RFL1. A portion of the second substrate portion PCB2 adjacent to the connection portion CNP may be exposed through the first opening OP1.

The first release film RFL1 may overlap the flexible circuit film FPC and may not overlap the first connection portion CNP1. The first connection portion CNP1 may be exposed through the first opening OP1. A portion of the flexible circuit film FPC adjacent to the first connection portion CNP1 may be exposed through the first opening OP1.

The flexible circuit film FPC may extend farther outside than the first release film RFL1 in the second direction DR2. The second connection portion CNP2 and a portion of the flexible circuit film FPC adjacent to the second connection portion CNP2 may be disposed farther outside than the first release film RFL1, and thus may not overlap the first release film RFL1.

A second opening OP2 may be defined in the first release film RFL1. The second opening OP2 may be adjacent to the second conductive adhesive CTP2 in the first direction DR1. The second opening OP2 may not overlap the second release film RFL2. Functions of the second opening OP2 will be described in detail later.

The second release film RFL2 may extend in the second direction DR2. The second release film RFL2 may be disposed below the rear surface BS1 of the printed circuit board PCB. The second release film RFL2 may extend farther outside than the first release film RFL1 in the second direction DR2. The second release film RFL2 may overlap the first substrate portion PCB1 and the second substrate portion PCB2, and may not overlap the connection portion CNP and the bonding portion BNP. The second release film RFL2 may overlap the first conductive adhesive CTP1 and the second conductive adhesive CTP2.

The first adhesive TAP1 may be adjacent to the first opening OP1 in the second direction DR2. The first adhesive TAP1 may be adjacent to the first conductive adhesive CTP1 in the first direction DR1. The first adhesive TAP1 may not overlap the connector CNT. The first adhesive TAP1 may overlap a portion of the first release film RFL1 and a portion of the second release film RFL2. The first adhesive TAP1 may fix the first release film RFL1 and the second release film RFL2. The configuration of the first adhesive TAP1 will be described in detail later.

The second adhesive TAP2 may overlap the second release film RFL2. The second adhesive TAP2 may be adjacent to the second conductive adhesive CTP2 in the first direction DR1. In a plan view, the first opening OP1 may be disposed, in the second direction DR2, between the first adhesive TAP1 and the second adhesive TAP2, and between the second opening OP2 and the first adhesive TAP1. In a plan view, the second substrate portion PCB2 may be disposed between the first adhesive TAP1 and the second adhesive TAP2 in the second direction DR2.

Figure 6:
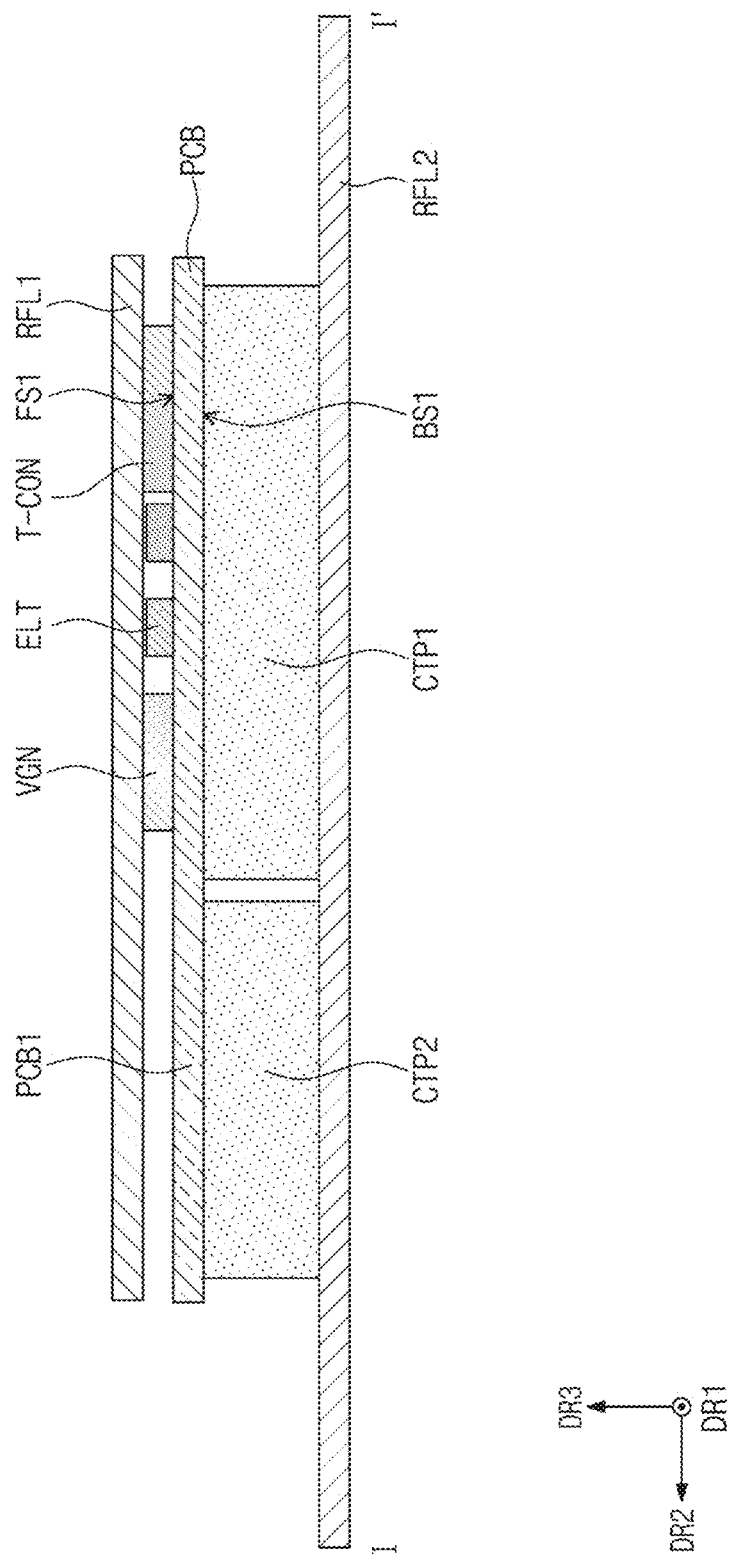
FIG. 6 is a cross-sectional view of line I-I' shown in FIG. 4.
Figure 9:
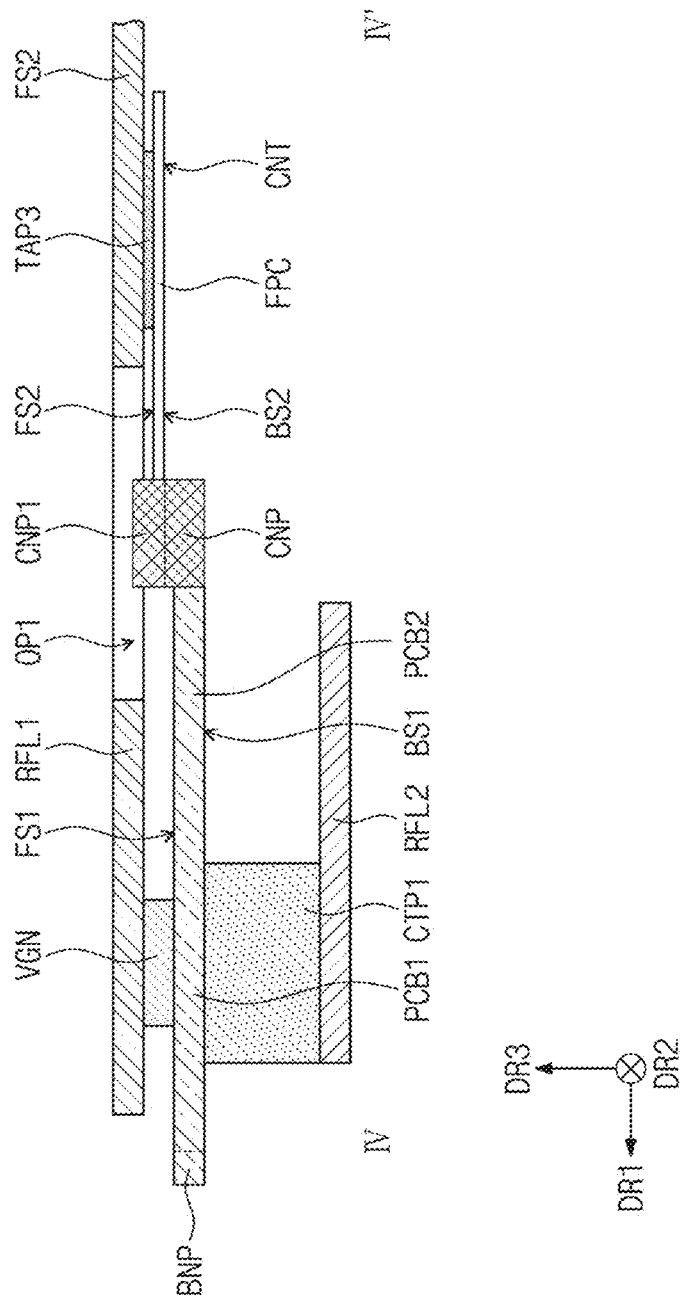
FIG. 9 is a cross-sectional view of line IV-IV' shown in FIG. 4.

FIG. 6 is a cross-sectional view of line I-I' shown in FIG. 4. FIGS. 7A and 7B are cross-sectional views of line II-II' shown in FIG. 4. FIGS. 8A and 8B are cross-sectional views of line III-III' shown in FIG. 4. FIG. 9 is a cross-sectional view of line IV-IV' shown in FIG. 4.

Hereinafter, FIGS. 4 and 5 will be described together with FIGS. 6 to 9 when needed for description. In addition, for convenience of description, only components corresponding to portions of cross-sectional lines are shown in FIGS. 6 to 9.

Referring to FIGS. 4, 5, and 6, the timing controller T-CON, the voltage generator VGN, and the elements ELT may be disposed on the first substrate portion PCB1. The timing controller T-CON, the voltage generator VGN, and the elements ELT may be disposed on the front surface FS1 of the first substrate portion PCB1 overlapping the first conductive adhesive CTP1.

The first release film RFL1 is disposed on the front surface FS1 of the first substrate portion PCB1, and may cover the front surface FS1 of the first substrate portion PCB1. The first release film RFL1 is disposed on the timing controller T-CON, the voltage generator VGN, and the elements ELT, and may cover the timing controller T-CON, the voltage generator VGN, and the elements ELT. The timing controller T-CON, the voltage generator VGN, and the elements ELT may be protected through the first release film RFL1.

The first conductive adhesive CTP1 and the second conductive adhesive CTP2 are disposed below the rear surface BS1 of the first substrate portion PCB1, and may be arranged in the second direction DR2. The first conductive adhesive CTP1 and the second conductive adhesive CTP2 may be attached to the rear surface BS1 of the first substrate portion PCB1.

The second release film RFL2 is disposed below the rear surface BS1 of the first substrate portion PCB1, and may cover the rear surface BS1 of the first substrate portion PCB1. The second release film RFL2 is disposed below the first conductive adhesive CTP1 and the second conductive adhesive CTP2, and may cover the first conductive adhesive CTP1 and the second conductive adhesive CTP2. The first conductive adhesive CTP1 and the second conductive adhesive CTP2 may be protected through the second release film RFL2.

The first conductive adhesive CTP1 may include a single-sided adhesive (e.g., single-sided tape). In an embodiment, an adhesive may be disposed on the front surface (e.g., upper surface in FIG. 6) of the first conductive adhesive CTP1 facing the first substrate portion PCB1, and an adhesive may not be disposed on the rear surface (e.g., lower surface in FIG. 6) of the first conductive adhesive CTP1 opposite to the front surface of the first conductive adhesive CTP1, for example. The rear surface of the first conductive adhesive CTP1 may face the second release film RFL2.

The second conductive adhesive CTP2 may include a double-sided adhesive (e.g., double-sided tape). In an embodiment, adhesives may be respectively disposed on the front surface (e.g., upper surface in FIG. 6) of the second conductive adhesive CTP2 facing the first substrate portion PCB1 and on the rear surface (e.g., lower surface in FIG. 6) of the second conductive adhesive CTP2 opposite the front surface of the second conductive adhesive CTP2, for example. The rear surface of the second conductive adhesive CTP2 may face the second release film RFL2.

The first conductive adhesive CTP1, which is a single-sided adhesive (e.g., single-sided tape), may be attached to the first substrate portion PCB1 and may not be attached to the second release film RFL2. The second conductive adhesive CTP2, which is a double-sided adhesive (e.g., double-sided tape), may be attached to the first substrate portion PCB1 and the second release film RFL2. Referring to FIGS. 4, 5, 7A, and 7B, the first adhesive TAP1 may be attached to a portion of one surface of the first release film RFL1. Specifically, the first adhesive TAP1 may be attached to a portion of the rear surface (e.g., lower surface in FIG. 7A) of the first release film RFL1 that does not overlap the second release film RFL2. The rear surface of the first release film RFL1 may be defined as one surface of the first release film RFL1 facing the printed circuit board PCB and the connector CNT.

The first adhesive TAP1 extends towards the second release film RFL2, and may cover a portion of the rear surface (e.g., lower surface in FIG. 7A) of the second release film RFL2. The rear surface of the second release film RFL2 may be defined as one surface of the second release film RFL2 that does not face the first release film RFL1. The first adhesive TAP1 may not be attached to the second release film RFL2.

In an embodiment, the first adhesive TAP1 may be defined as a clasp tape. The first adhesive TAP1 is attached to the rear surface of the first release film RFL1 and covers a portion of the rear surface of the second release film RFL2, and accordingly, the second release film RFL2 may be fixed to the first release film RFL1.

The first adhesive TAP1 may include a base film BFM disposed below the first release film RFL1, and a double-sided adhesive (e.g., double-sided tape) TA disposed on the base film BFM. The double-sided adhesive TA is disposed between the base film BFM and the first release film RFL1, and may be attached to the base film BFM and the first release film RFL1.

The double-sided adhesive TA may be attached to a portion of the rear surface of the first release film RFL1 that does not overlap the second release film RFL2. The base film BFM may be attached to one surface of the double-sided adhesive TA that does not face the first release film RFL1.

The base film BFM extends towards the second release film RFL2, and may cover a portion of the rear surface of the second release film RFL2. The base film BFM may not be attached to the second release film RFL2. The base film BFM may serve to support the second release film RFL2 to prevent the second release film RFL2 separating from the first release film RFL1. Accordingly, the second release film RFL2 may be fixed to the first release film RFL1 through the double-sided adhesive TA and the base film BFM.

When the printed circuit board PCB is bonded to a display module, the second release film RFL2 may be removed from the printed circuit board PCB by an operator. The second release film RFL2 may be removed from the right end to the left end in FIG. 5. The right end of the second release film RFL2 disposed farther outside than the first release film RFL1 may be gripped to remove the second release film RFL2.

As shown in 7B, even when the second release film RFL2 is removed, the first adhesive TAP1 attached to the first release film RFL1 is not removed, but is kept being attached to the first release film RFL1.

Referring to FIGS. 4, 5, 8A, and 8B, the second adhesive TAP2 is disposed between the first release film RFL1 and the second release film RFL2, and may be attached to the first release film RFL1 and the second release film RFL2. The second adhesive TAP2 may include a double-sided adhesive (e.g., double-sided tape).

As shown in FIG. 8B, the second adhesive TAP2 may be removed along with the second release film RFL2 when the second release film RFL2 is removed from the printed circuit board PCB. In an embodiment, the front surface of the second adhesive TAP2 facing the first release film RFL1 may have a less adhesive force than the rear surface of the second adhesive TAP2 facing the second release film RFL2, for example.

Referring to FIGS. 4, 5, and 9, the first release film RFL1 is disposed on the front surface FS2 of the connector CNT, and may cover the front surface FS2 of the connector CNT. The first release film RFL1 is disposed on the front surface FS1 of the first substrate portion PCB1 and the front surface FS1 of the second substrate portion PCB2, and may cover the front surface FS1 of the first substrate portion PCB1, and the front surface FS1 of the second substrate portion PCB2.

The first connection portion CNP1 is disposed on the connection portion CNP, and may be connected to the connection portion CNP. The connection portion CNP and the first connection portion CNP1, which are connected to each other may be exposed through the first opening OP1 defined in the first release film RFL1. A portion of the second substrate portion PCB2 adjacent to the connection portion CNP and a portion of the flexible circuit film FPC adjacent to the first connection portion CNP1 may be exposed through the first opening OP1.

The second release film RFL2 is disposed below the rear surface BS1 of the first substrate portion PCB1 and the rear surface BS1 of the second substrate portion PCB2, and may cover the rear surface BS1 of the first substrate portion PCB1, and the rear surface BS1 of the second substrate portion PCB2. The second release film RFL2 may not be disposed below the connection portion CNP. The second release film RFL2 may not be disposed below the rear surface BS2 of the connector CNT. That is, the second release film RFL2 may not cover the rear surface BS2 of the connector CNT.

The first release film RFL1 may not be disposed on the bonding portion BNP. The second release film RFL2 may not be disposed below the bonding portion BNP.

A third adhesive TAP3 is disposed between the flexible circuit film FPC and the first release film RFL1, and may be attached to the flexible circuit film FPC and the first release film RFL1. The third adhesive TAP3 may include a double-sided adhesive (e.g., double-sided tape). The first release film RFL1 may be attached to the flexible circuit film FPC through the third adhesive TAP3.

Figure 10:
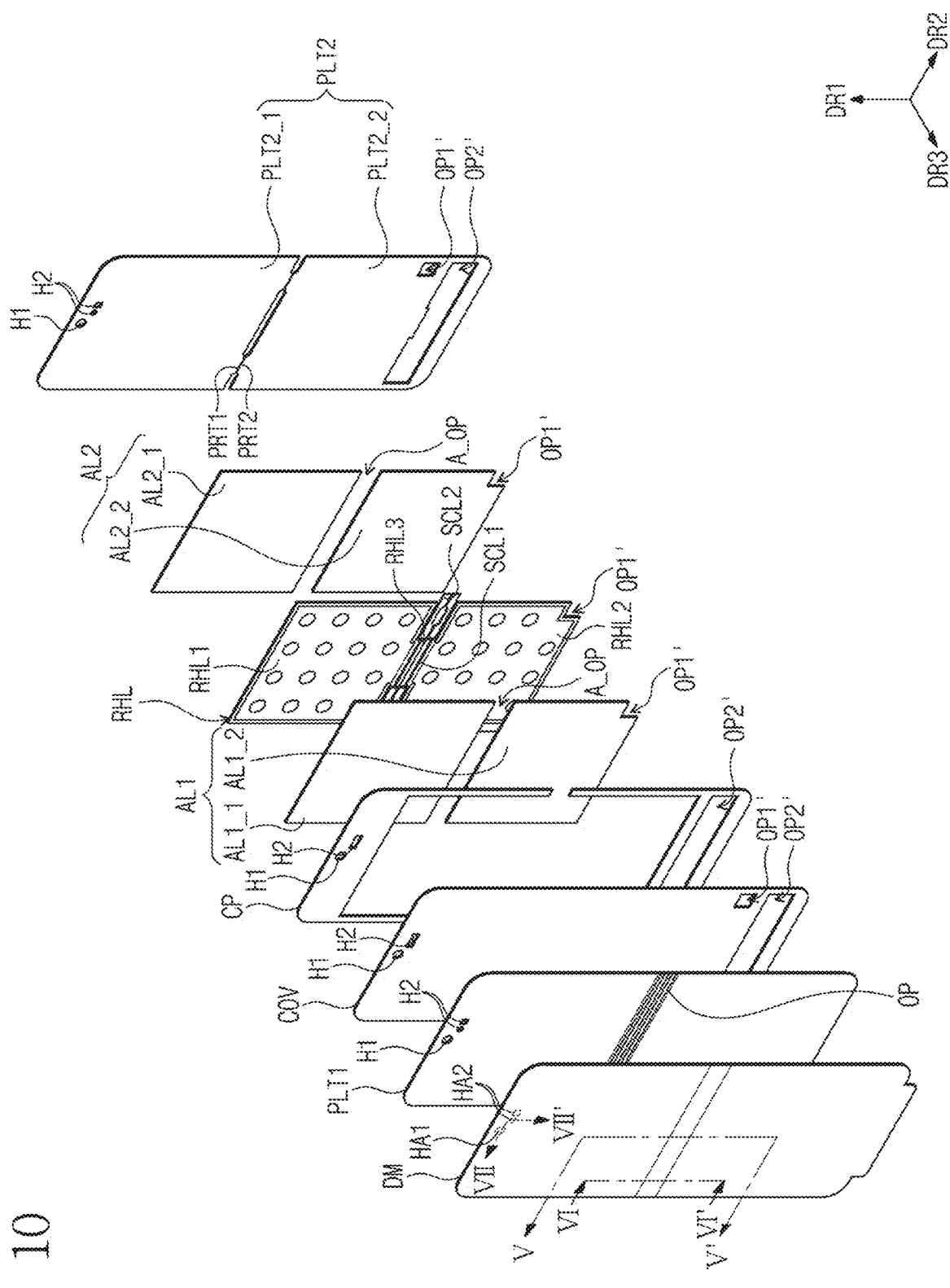
FIG. 10 is an exploded perspective view of the display device shown in FIG. 1.
Figure 11:
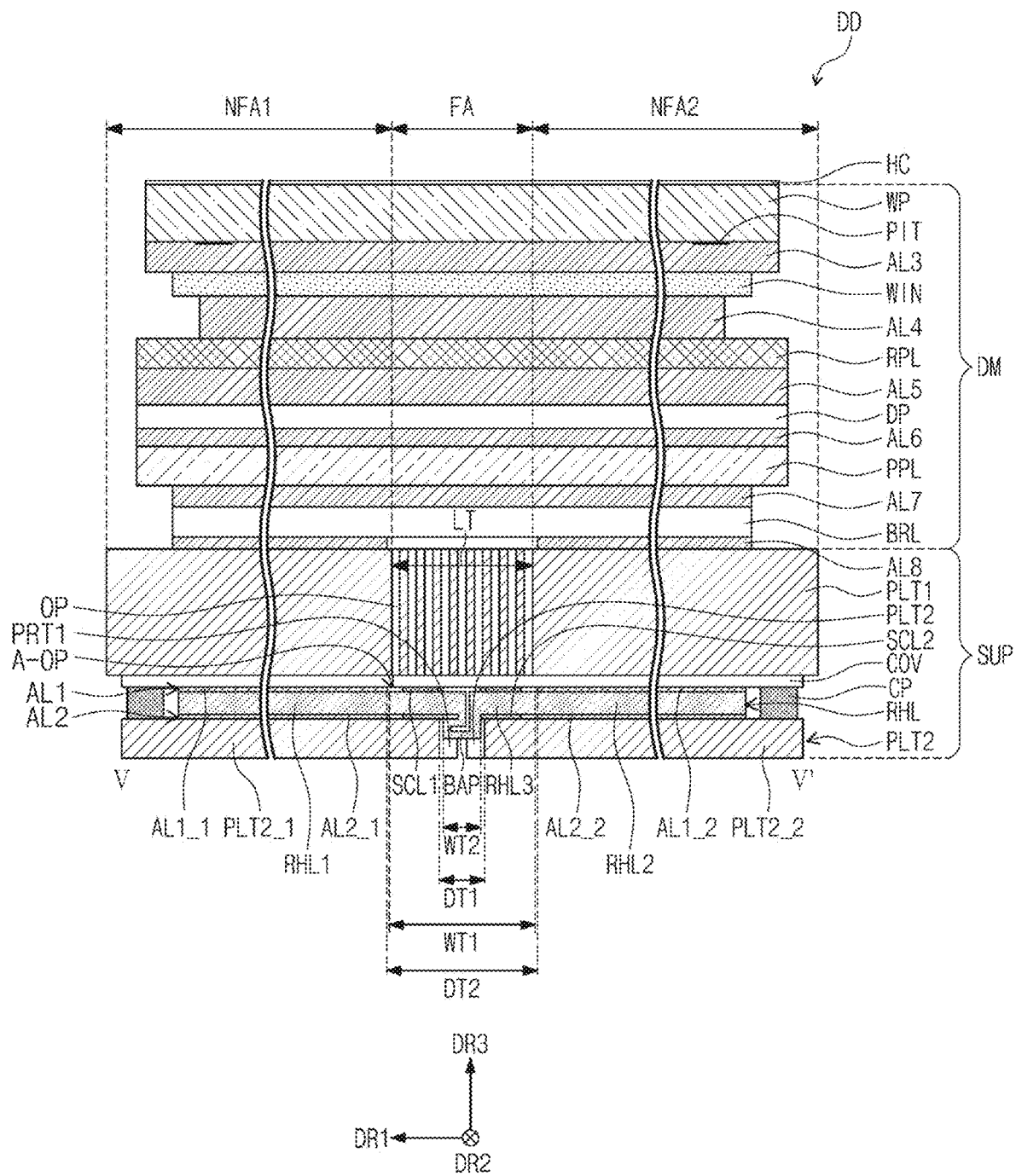
FIG. 11 is a cross-sectional view of line V-V' shown in FIG. 10.
Figure 12:
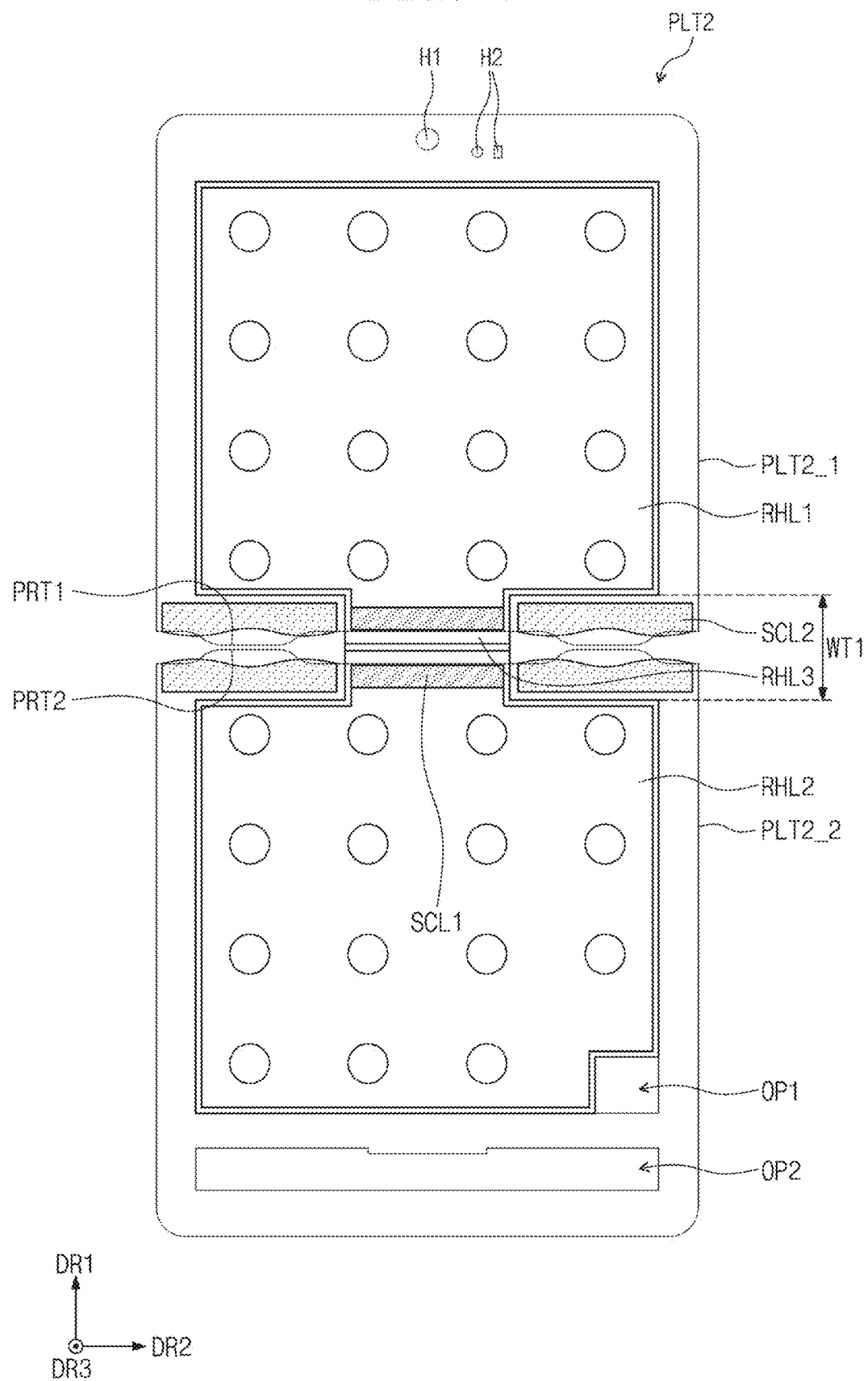
FIG. 12 is a plan view of a heat dissipation layer and first and second step compensation layers shown in FIG. 10.

FIG. 10 is an exploded perspective view of the display device shown in FIG. 1. FIG. 11 is a cross-sectional view of line V-V' shown in FIG. 10. FIG. 12 is a plan view of a heat dissipation layer, a second support plate, and first and second step compensation layers shown in FIG. 10.

Referring to FIGS. 10, 11 and 12, the display device DD in an embodiment of the invention may include a display module DM and a support portion SUP disposed below the display module DM. The display module DM may be a flexible display module. The display module DM may include the first non-folding region NFA1, the folding region FA, and the second non-folding region NFA2 arranged in the first direction DR1.

At least one first hole region HA1 and a plurality of second hole regions HA2 may be defined in the display module DM. The above-described camera CM may be disposed in the first hole region HA1 and the above-described sensors SN may be disposed in the second hole regions HA2.

The support portion SUP may support the display module DM below the display module DM. The support portion SUP may include a first support plate PLT1, a second support plate PLT2, a cover layer COV, a heat dissipation layer RHL, a first adhesive layer AL1, a second adhesive layer AL2, a step compensation layer CP, a plurality of first step compensation layers SCL1, and a plurality of second step compensation layers SCL2.

The first support plate PLT1 may be disposed below the display module DM to support the display module DM. The first support plate PLT1 may be more rigid than the display module DM.

In an embodiment, the first support plate PLT1 may include a metal material such as stainless steel. In an embodiment, the first support plate PLT1 may include SUS 304, for example, but is not limited thereto, and the first support plate PLT1 may include various metal materials. In addition, the first support plate PLT1 is not limited thereto, and may include a non-metal material such as glass or plastic.

In a portion of the first support plate PLT1 overlapping the folding region FA, a plurality of openings OP may be defined. Since the openings OP are defined in the portion of the first support plate PLT1 overlapping the folding region FA, the flexibility of the portion of the first support plate PLT1 overlapping the folding region FA may increase. As a result, the first support plate PLT1 may be easily foldable around the folding region FA.

The cover layer COV may be disposed below the first support plate PLT1, and cover the openings OP defined in the first support plate PLT1. The cover layer COV may have an elastic modulus lower than that of the first support plate PLT1. In an embodiment, the cover layer COV may include thermoplastic polyurethane or rubber, for example, but the material of the cover layer COV is not limited thereto. The cover layer COV may be manufactured in a sheet form and attached to the first support plate PLT1.

Below the first support plate PLT1, the second support plate PLT2 may be disposed. The cover layer COV may be disposed between the first support plate PLT1 and the second support plate PLT2. The second support plate PLT2 may be more rigid than the display module DM.

In an embodiment, the second support plate PLT2 may include a metal material such as stainless steel, but the material of the second support plate PLT2 is not limited thereto. In addition, the second support plate PLT2 is not limited thereto, and may include a non-metal material such as glass or plastic.

The second support plate PLT2 may include a 2_1 support plate PLT2_1 overlapping the first non-folding region NFA1 and a 2_2 support plate PLT2_2 overlapping the second non-folding region NFA2. The 2_1 support plate PLT2_1 and the 2_2 support plate PLT2_2 may be spaced apart from each other below the folding region FA.

The heat dissipation layer RHL may be disposed between the first support plate PLT1 and the second support plate PLT2. A portion of the heat dissipation layer RHL overlapping the folding region FA may be bent to be disposed between the 2_1 support plate PLT2_1 and the 2_2 support plate PLT2_2.

The heat dissipation layer RHL may serve heat dissipation function. In an embodiment, the heat dissipation layer RHL may include graphite, for example, but the material of the heat dissipation layer RHL is not limited thereto. Since the heat dissipation layer RHL serves the heat dissipation function with the first and second support plates PLT1 and PLT2, the heat dissipation performance of the display device DD may improve.

The heat dissipation layer RHL may include a first heat dissipation part RHL1, a second heat dissipation part RHL2, and a third heat dissipation part RHL3 disposed between the first heat dissipation part RHL1 and the second heat dissipation part RHL2. The first heat dissipation part RHL1 may overlap the first non-folding region NFA1, the second heat dissipation part RHL2 may overlap the second non-folding region NFA2, and the third heat dissipation part may overlap the folding region FA. As shown in FIGS. 10 and 12, based on the second direction DR2, the width of the third heat dissipation part RHL3 may be smaller than the width of each of the first and second heat dissipation parts RHL1 and RHL2.

As shown in FIG. 11, a portion of the third heat dissipation part RHL3 may be bent to be disposed between the 2_1 support plate PLT2_1 and the 2_2 support plate PLT2_2. The bend portion of the third heat dissipation part RHL3 may be defined as a bending portion BAP.

In a portion between the two omission marks shown in FIG. 5, a horizontal direction may be the first direction DR1. Based on the first direction DR1, a first distance DT1 between the 2_1 support plate PLT2_1 and the 2_2 support plate PLT2_2 may be smaller than a first width WT1 of the third heat dissipation part RHL3. Based on the first direction DR1, a second width WT2 of the bending portion BAP may be smaller than the first distance DT1 between the 2_1 support plate PLT2_1 and the 2_2 support plate PLT2_2.

In an embodiment, based on the first direction DR1, the first width WT1 of the third heat dissipation part RHL3 may be about 9.65 millimeters, and the second width WT2 of the bending portion BAP may be about 0.6 millimeter. In an embodiment, based on the first direction DR1, the first distance DT1 between the 2_1 support plate PLT2_1 and the 2_2 support plate PLT2_2 may be about 1.6 millimeters to about 1.8 millimeters. In an embodiment, based on the first direction DR1, a length LT of the portion of the first support plate PLT1 in which the openings OP are defined may be about 8.65 millimeters.

The bending portion BAP may protrude below the first and second heat dissipation parts RHL1 and RHL2 and be disposed between the 2_1 support plate PLT2_1 and the 2_2 support plate PLT2_2. In an embodiment, the bending portion BAP may be bent twice, first in the downward direction and then in the left direction, but the bending shape of the bending portion BAP is not limited thereto. In a state in which the display module DM and the support portion SUP are unfolded, the bending portion BAP may remain bent.

The first heat dissipation part RHL1, the second heat dissipation part RHL2, and the third heat dissipation part RHL3 may be formed or provided as a single unitary body. When a separable heat dissipation layer is used, the third heat dissipation part RHL3 is not used, but the first heat dissipation part RHL1 and the second heat dissipation part RHL2 separated from each other may be used. However, in an embodiment of the invention, an integrated heat dissipation layer RHL is used, so that the third heat dissipation part RHL3 may be further disposed below the folding region FA. Accordingly, the heat dissipation performance of the display device DD may improve.

The third heat dissipation part RHL3 may be bent and disposed below the folding region FA. Therefore, the area of the heat dissipation layer RHL may further expand through the bending portion BAP. Since the heat dissipation performance is proportional to the area of the heat dissipation layer RHL, the heat dissipation performance of the display device DD may improve.

In a region overlapping the first and second heat dissipation parts RHL1 and RHL2, the 2_1 support plate PLT2_1 may include first protrusion portions PRT1 protruding in the first direction DR2, and the 2_2 support plate PLT2_2 may include second protrusion portions PRT2 protruding in the first direction DR1. The first protrusion portions PRT1 and the second protrusion portions PRT2 may protrude towards each other.

In accordance with the structure, in the region overlapping the first and second heat dissipation parts RHL1 and RHL2, the 2_1 support plate PLT2_1 and the 2_2 support plate PLT2_2 are disposed adjacent to each other, so that the second step compensation layers SCL2 may be more easily supported. In a region overlapping the third heat dissipation part RHL3, spacing between the 2_1 support plate PLT2_1 and the 2_2 support plate PLT2_2 may be larger than spacing between the first protrusion portions PRT1 and the second protrusion portions PRT2.

The first adhesive layer AL1 is disposed between the cover layer COV and the heat dissipation layer RHL, and the cover layer COV may be disposed between the first support plate PLT1 and the first adhesive layer AL1. That is, the first adhesive layer AL1 may not be disposed below the folding region FA.

The first adhesive layer AL1 may include a 1_1 adhesive layer AL1_1 overlapping the first non-folding region NFA1 and a 1_2 adhesive layer AL1_2 overlapping the second non-folding region NFA2. The 1_2 adhesive layer AL1_2 may be spaced apart from the 1_1 adhesive layer AL1_1.

Based on the first direction DR1, a second distance DT2 between the 1_1 adhesive layer AL1_1 and the 1_2 adhesive layer AL1_2 may be larger than the length LT of the portion of the first support plate PLT1 in which the openings OP are defined. Based on the first direction DR1, the second distance DT2 between the 1_1 adhesive layer AL1_1 and the 1_2 adhesive layer AL1_2 may be larger than the first width WT1 of the third heat dissipation part RHL3.

The 1_1 adhesive layer AL1_1 and the 1_2 adhesive layer AL1_2 may not overlap the folding region FA. The 1_1 adhesive layer AL1_1 and the 1_2 adhesive layer AL1_2 may substantially have the same shapes as those of the first heat dissipation part RHL1 and the second heat dissipation part RHL2, respectively. Since the first adhesive layer AL1 is not disposed below the folding region FA, the folding operation of the support portion SUP may be performed more easily.

The second adhesive layer AL2 may be disposed between the second support plate PLT2 and the heat dissipation layer RHL. The second adhesive layer AL2 may not be disposed below the folding region FA. The second adhesive layer AL2 may include a 2_1 adhesive layer AL2_1 overlapping the first non-folding region NFA1 and a 2_2 adhesive layer AL2_2 overlapping the second non-folding region NFA2. The 2_2 adhesive layer AL2_2 may be spaced apart from the 2_1 adhesive layer AL2_1. Based on the first direction DR1, the second distance DT2 between the 2_1 adhesive layer AL2_1 and the 2_2 adhesive layer AL2_2 may be larger than the first width WT1 of the third heat dissipation part RHL3.

The 2_1 adhesive layer AL2_1 and the 2_2 adhesive layer AL2_2 may not overlap the folding region FA. The 2_1 adhesive layer AL2_1 and the 2_2 adhesive layer AL2_2 may substantially have the same shape as that of the first heat dissipation part RHL1 and the second heat dissipation part RHL2, respectively. Since the second adhesive layer AL2 is not disposed below the folding region FA, the folding operation of the support portion SUP may be performed more easily.

A space between the 1_1 adhesive layer AL1_1 and the 1_2 adhesive layer AL1_2 may be an open portion A_OP of the first adhesive layer AL1 overlapping the folding region FA. A space between the 2_1 adhesive layer AL2_1 and the 2_2 adhesive layer AL2_2 may be an open portion A_OP of the second adhesive layer AL2 overlapping the folding region FA. The second distance DT2 may be greater than the first and second widths WT1 and WT2. Therefore, each of the first and second adhesive layers AL1 and AL2 may be open to a greater width than that of the third heat dissipation part RHL3 and that of the bending portion BAP in the folding region FA.

The step compensation layer CP may be disposed between the cover layer COV and the second support plate PLT2. The step compensation layer CP may be disposed around the edge of the heat dissipation layer RHL and around the edge of each of the first and second adhesive layers AL1 and AL2.

The step compensation layer CP may include a double-sided adhesive (e.g., double-sided tape).

The heat dissipation layer RHL and the first and second adhesive layers AL1 and AL2 may not be disposed in a portion adjacent to the edge of the cover layer COV and the edge of the second support plate PLT2. The step compensation layer CP may be adjacent to the edges of the cover layer COV and the second support plate PLT2. The step compensation layer CP may surround the heat dissipation layer RHL and the first and second adhesive layers AL1 and AL2.

The step compensation layer CP may be disposed between the cover layer COV and the second support plate PLT2 in a portion in which the first and second adhesive layers AL1 and AL2 are not disposed. The step compensation layer CP may compensate for a step of the heat dissipation layer RHL and the portion in which the first and second adhesive layers AL1 and AL2 are not disposed.

The first step compensation layers SCL1 may overlap the folding region FA, and may be disposed in a region in which the first adhesive layer AL1 is open. That is, the first step compensation layers SCL1 may be disposed between the 1_1 adhesive layer AL1_1 and the 1_2 adhesive layer AL1_2.

The first step compensation layer SCL1 may be disposed between the heat dissipation layer RHL and the first support plate PLT1. Specifically, the first step compensation layers SCL1 may be disposed between the heat dissipation layer RHL and the cover layer COV. The first step compensation layers SCL1 may compensate for a step of a portion in which the first adhesive layer AL1 is not disposed.

As shown in FIGS. 10 and 12, the second step compensation layers SCL2 may overlap the folding region FA, and may be disposed between the first heat dissipation part RHL1 and the second heat dissipation part RHL2. The second step compensation layers SCL2 may be disposed around the third heat dissipation part RHL3. The third heat dissipation part RHL3 may be disposed between the second step compensation layers SCL2.

In an embodiment, two first step compensation layers SCL1 and four second step compensation layers SCL2 are shown. However, the number of the first step compensation layers SCL1 and the number of the second step compensation layers SCL2 are not limited thereto.

Hereinafter, in the disclosure, "thickness" refers to a numerical value measured in the third direction DR3. In FIG. 11, "width" may be defined as a numerical value measured in the horizontal direction.

Referring to FIG. 11, the thickness of the first support plate PLT1 may be greater than the thickness of the second support plate PLT2, and the thickness of the second support plate PLT2 may be greater than the thickness of each of the heat dissipation layer RHL and the step compensation layer CP. The thickness of the step compensation layer CP may be greater than the thickness of the heat dissipation layer RHL. The thickness of the heat dissipation layer RHL may be greater than the thickness of the cover layer COV. The thickness of the cover layer COV may be greater than the thickness of each of the first and second adhesive layers AL1 and AL2.

The width of the first support plate PLT1 may be greater than the width of the second support plate PLT2 and the width of the cover layer COV. The edge of each of the second support plate PLT2 and the cover layer COV may be disposed on a further inner side than the edge of the first support plate PLT1. The edge of the step compensation layer CP may be disposed on a further inner side than the edge of each of the second support plate PLT2 and the cover layer COV.

The width of the heat dissipation layer RHL and the width of each of the first and second adhesive layers AL1 and AL2 may be smaller than the width of the second support plate PLT2 and the width of the cover layer COV. The heat dissipation layer RHL and the first and second adhesive layers AL1 and AL2 may be disposed on a further inner side than the step compensation layer CP.

Referring to FIG. 10, on each of the first support plate PLT1 and the second support plate PLT2, a first hole H1 and second holes H2 which respectively overlap the first hole region HA1 and the second hole regions HA2 may be defined. The first and second holes H1 and H2 may be defined in each of the cover layer COV and the step compensation layer CP. In an embodiment, on each of the cover layer COV and the step compensation layer CP, the second holes H2 may be defined as a single unitary hole. The heat dissipation layer RHL, the first and second adhesive layers AL1 and AL2, and the first and second step compensation layers SCL1 and SCL2 may not overlap the first and second holes H1 and H2.

On each of the cover layer COV and the second support plate PLT2, a first opening OP1' and a second opening OP2' may be defined. The first opening OP1' may be adjacent to the second opening OP2'. The second opening OP2' may also be defined in the step compensation layer CP. In the step compensation layer CP, the first opening OP1' may not be defined.

The first opening OP1' may also be defined in each of the heat dissipation layer RHL and the first and second adhesive layers AL1 and AL2. Substantially, portions of the heat dissipation layer RHL and the first and second adhesive layers AL1 and AL2, the portions overlapping the first opening OP1' of the second support plate PLT2 may be removed, so that the first openings OP1' may be defined in the heat dissipation layer RHL and the first and second adhesive layers AL1 and AL2. Corners of the heat dissipation layer RHL and the first and second adhesive layers AL1 and AL2 may be removed, so that the first openings OP1' may be defined in the heat dissipation layer RHL and the first and second adhesive layers AL1 and AL2.

Referring to FIGS. 10 and 11, the display module DM may be attached on the support portion SUP. The display module DM may be attached to an upper surface of the first support plate PLT1. The first support plate PLT1 may support the display module DM. By the heat dissipation layer RHL, the first support plate PLT1, and the second support plate PLT2, heat generated in the display module DM may be released.

The 2_1 support plate PLT2_1 may support the first non-folding region NFA1, and the 2_2 support plate PLT2_2 may support the second non-folding region NFA2. The 2_1 support plate PLT2_1 and the 2_2 support plate PLT2_2 may extend to the folding region FA and disposed adjacent to each other in the folding region FA.

The 2_1 support plate PLT2_1 and the 2_2 support plate PLT2_2 may support, below the folding region FA, the portion of the first support plate PLT1 in which the openings OP are disposed. When pressure is applied to the first support plate PLT1 from the above, the deformation of the portion of the first support plate PLT1 in which the openings OP are defined may be prevented by the 2_1 support plate PLT2_1 and the 2_2 support plate PLT2_2.

The display module DM may include the display panel DP, a reflection prevention layer RPL, a window WIN, a window protection layer WP, a hard coating layer HC, a panel protection layer PPL, a barrier layer BRL, and third to eighth adhesive layers AL3 to AL8. The reflection prevention layer RPL, the window WIN, the window protection layer WP, and the hard coating layer HC may be disposed on the display panel DP. The panel protection layer PPL and the barrier layer BRL may be disposed below the display panel DP.

The reflection prevention layer RPL may be disposed on the display panel DP. The reflection prevention layer RPL may be defined as an external light reflection prevention film. The reflection prevention layer RPL may reduce the reflectance of external light incident towards the display panel DP from the outside.

When the external light incident towards the display panel DP is reflected from the display panel DP and provided again to an external user, like a mirror, the user may visually recognize the external light. In order to prevent the above phenomenon, as an example, the reflection prevention layer RPL may include a plurality of color filters displaying the same color as pixels.

The color filters may filter the external light to the same color as that of the pixels. In this case, the external light may not be visually recognized by the user. However, the invention is not limited thereto, and the reflection prevention layer RPL may include a phase retarder and/or a polarizer in order to reduce the reflectance of the external light.

The window WIN may be disposed on the reflection prevention layer RPL. The window WIN may protect the display panel DP and the reflection prevention layer RPL from external scratches. The window WIN may have optically transparent properties. The window WIN may include glass. However, the invention is not limited thereto, and the window WIN may include a synthetic resin film.

The window WIN may have a multi-layered structure or a single-layered structure. In an embodiment, the window WIN may include a plurality of synthetic resin films bonded with an adhesive, or a glass substrate and a synthetic resin film bonded with an adhesive, for example.

The window protection layer WP may be disposed on the window WIN. In an embodiment, the window protection layer WP may include a flexible plastic material such as polyimide or polyethylene terephthalate. The hard coating layer HC may be disposed on an upper surface of the window protection layer WP.

A print layer PIT may be disposed on a lower surface of the window protection layer WP. The print layer PIT may be black, but the color of the print layer PIT is not limited thereto. The print layer PIT may be adjacent to the edge of the window protection layer WP.

The third adhesive layer AL3 may be disposed between the window protection layer WP and the window WIN. By the third adhesive layer AL3, the window protection layer WP and the window WIN may be bonded to each other. The third adhesive layer AL3 may cover the print layer PIT.

The fourth adhesive layer AL4 may be disposed between the window WIN and the reflection prevention layer RPL. By the fourth adhesive layer AL4, the window WIN and the reflection prevention layer RPL may be bonded to each other. The fifth adhesive layer AL5 may be disposed between the reflection prevention layer RPL and the display panel DP. By the fifth adhesive layer AL5, the reflection prevention layer RPL and the display panel DP may be bonded to each other.

The panel protection layer PPL may be disposed below the display panel DP. The panel protection layer PPL may protect a lower portion of the display panel DP. The panel protection layer PPL may include a flexible plastic material. In an embodiment, the panel protection layer PPL may include polyethylene terephthalate ("PET"), for example.

The barrier layer BRL may be disposed below the panel protection layer PPL. The barrier layer BRL may increase resistance against compressive force caused by external pressing. Therefore, the barrier layer BRL may serve to prevent the deformation of the display panel DP. In an embodiment, the barrier layer BRL may include a flexible plastic material such as polyimide or polyethylene terephthalate.

The barrier layer BRL may have a color which absorbs light. The barrier layer BRL may be black. In this case, when the display module DM is viewed from above the display module DM, elements disposed below the barrier layer BRL may not be visually recognized.

The sixth adhesive layer AL6 may be disposed between the display panel DP and the panel protection layer PPL. The display panel DP and the panel protection layer PPL may be bonded to each other by the sixth adhesive layer AL6. The seventh adhesive layer AL7 may be disposed between the panel protection layer PPL and the barrier layer BRL. The panel protection layer PPL and the barrier layer BRL may be bonded to each other by the seventh adhesive layer AL7.

The eighth adhesive layer AL8 may be disposed between the barrier layer BRL and the first support plate PLT1. The barrier layer BRL and the first support plate PLT1 may be bonded to each other by the eighth adhesive layer AL8. The eighth adhesive layer AL8 may not overlap the folding region FA. That is, the eighth adhesive layer AL8 may not be disposed in the folding region FA.

In an embodiment, the first to eighth adhesive layers AL1 and AL8 may include a transparent adhesive, such as a pressure sensitive adhesive ("PSA") or an optically clear adhesive ("OCA"), but the type of the adhesive is not limited thereto.

The thickness of the panel protection layer PPL may be smaller than the thickness of the window protection layer WP, the thickness of the reflection prevention layer RPL may be smaller than the thickness of the panel protection layer PPL, and the thickness of the display panel DP may be smaller than the thickness of the reflection prevention layer RPL. The thickness of the window WIN may be the same as the thickness of the reflection prevention layer RPL. The thickness of the barrier layer BRL may be smaller than the thickness of the panel protection layer PPL, and may be greater than the thickness of the reflection prevention layer RPL.

The thickness of the third adhesive layer AL3 may be the same as the thickness of the barrier layer BRL, and the thickness of the fourth adhesive layer AL4 and the fifth adhesive layer AL5 may be the same as the thickness of the panel protection layer PPL. The thickness of each of the sixth adhesive layer AL6 and the seventh adhesive layer AL7 may be smaller than the thickness of the display panel DP. The sixth adhesive layer AL6 and the seventh adhesive layer AL7 may have the same thickness as each other.

The thickness of the eighth adhesive layer AL8 may be smaller than the thickness of each of the sixth adhesive layer AL6 and the seventh adhesive layer AL7, and the thickness of the hard coating layer HC may be smaller than the thickness of the eighth adhesive layer AL8. The thickness of each of the first and second adhesive layers AL1 and AL2 may be smaller than the thickness of the hard coating layer HC.

The width of the first support plate PLT1 may be greater than the width of the display module DM. The edge of the display module DM may be disposed on a further inner side than the edge of the first support plate PLT1. The display panel DP, the reflection prevention layer RPL, the panel protection layer PPL, and the fifth and sixth adhesive layers AL5 and AL6 may have the same width as each other. The window protection layer WP and the third adhesive layer AL3 may have the same width as each other.

The widths of the display panel DP, the reflection prevention layer RPL, the panel protection layer PPL, and the fifth and sixth adhesive layers AL5 and AL6 may be greater than the widths of the window protection layer WP and the third adhesive layer AL3. The edges of the display panel DP, the reflection prevention layer RPL, the panel protection layer PPL, and the fifth and sixth adhesive layers AL5 and AL6 may be disposed on a further outer side than the edges of the window protection layer WP and the third adhesive layer AL3.

The widths of the window WIN and the fourth adhesive layer AL4 may be smaller than the widths of the window protection layer WP and the third adhesive layer AL3. The width of the fourth adhesive layer AL4 may be smaller than the width of the window WIN. The edge of the window WIN may be disposed on a further inner side than the edges of the window protection layer WP and the third adhesive layer AL3. The edge of the fourth adhesive layer AL4 may be disposed on a further inner side than the edge of the window WIN.

The barrier layer BRL and the seventh and eighth adhesive layers AL7 and AL8 may have the same width as each other. The edges of the barrier layer BRL and the seventh and eighth adhesive layers AL7 and AL8 may be disposed on a further inner side than the edges of the display panel DP, the reflection prevention layer RPL, the panel protection layer PPL, and the fifth and sixth adhesive layers AL5 and AL6.

Figure 13:
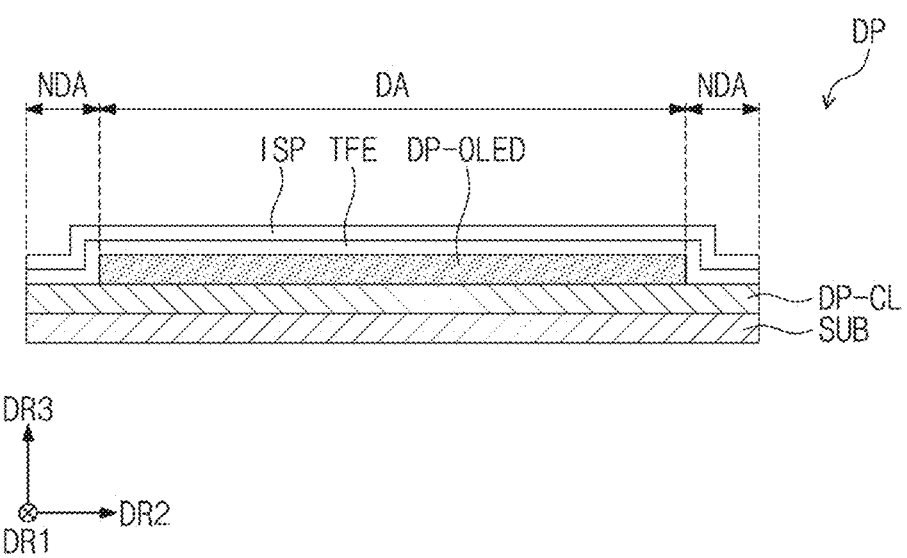
FIG. 13 is a view illustrating a cross-section of a display panel shown in FIG. 11 as an example.

FIG. 13 is a view illustrating a cross-section of the display panel shown in FIG. 11 as an example.

Referring to FIG. 13, the display panel DP may include a substrate SUB, a circuit element layer DP-CL disposed on the substrate SUB, a display element layer DP-OLED disposed on the circuit element layer DP-CL, a thin film encapsulation layer TFE disposed on the display element layer DP-OLED, and an input sensing unit ISP disposed on the thin film encapsulation layer TFE. The display element layer DP-OLED may be disposed on the display region DA.

The substrate SUB may include a display region DA and a non-display region NDA around the display region DA. The substrate SUB may include a flexible plastic material. In an embodiment, the substrate SUB may include polyimide ("PI"), for example.

A plurality of pixels PX may be disposed in the circuit element layer DP-CL and the display element layer DP-OLED. The pixels PX may each include transistors disposed on the circuit element layer DP-CL and emission elements disposed on the display element layer DP-OLED and connected to the transistors.

The thin film encapsulation layer TFE may be disposed on the circuit element layer DP-CL to cover the display element layer DP-OLED. The thin film encapsulation layer TFE may include an inorganic layer, an organic layer, and an inorganic layer sequentially stacked. The inorganic layers include an inorganic material, and may protect the pixels from moisture/oxygen. In an embodiment, the organic layer includes an organic material, and may protect the pixels PX from foreign materials such as dust particles.

The input sensing unit ISP may include a plurality of sensors (now illustrated) for sensing an external input. The sensors may sense the external input in a capacitive manner. In an embodiment, the external input may include various forms of inputs such as a part of a user's body, light, heat, a pen, and pressure.

The input sensing unit ISP may be directly manufactured on the thin film encapsulation layer TFE, when manufacturing the display panel DP. However, the invention is not limited thereto, and the input sensing unit ISP may be manufactured as a separate panel from the display panel DP, and be attached to the display panel DP by an adhesive layer.

Figure 14:
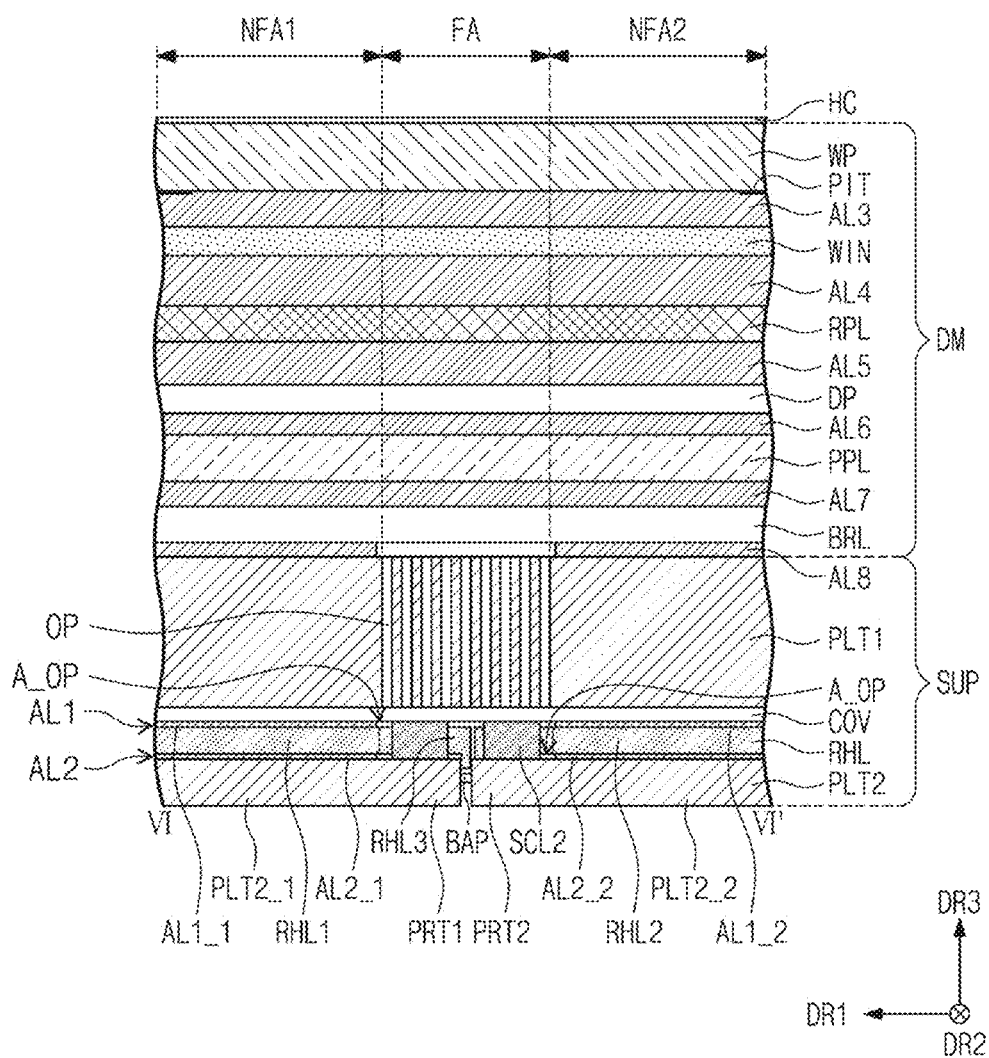
FIG. 14 is a cross-sectional view of line VI-VI' shown in FIG. 10.

FIG. 14 is a cross-sectional view of line VI-VI' shown in FIG. 10.

Referring to FIGS. 10, 12, and 14, the second step compensation layers SCL2 may overlap the folding region FA, and may be disposed between the cover layer COV and the second support plate PLT2. The second step compensation layers SCL2 may be disposed between the first heat dissipation layer RHL1 and the second heat dissipation layer RHL2, between the 1_1 adhesive layer AL1_1 and the 1_2 adhesive layer AL1_2 (or the opening A_OP), and between the 2_1 adhesive layer AL2_1 and the 2_2 adhesive layer AL2_2 (or the opening A_OP).

The second step compensation layers SCL2 may be disposed in a portion between the first heat dissipation layer RHL1 and the second heat dissipation layer RHL2 in which the third heat dissipation part RHL3 and the first and second adhesive layers AL1 and AL2 are not disposed. Based on the third direction DR3, the thickness of each of the second step compensation layers SCL2 may be greater than the thickness of each of the first step compensation layers SCL1. The second step compensation layers SCL2 may compensate for a step of the portion in which the third heat dissipation part RHL3 and the first and second adhesive layers AL1 and AL2 are not disposed. The first and second protrusion portions PRT1 and PRT2 may support the second step compensation layers SCL2.

Figure 15:
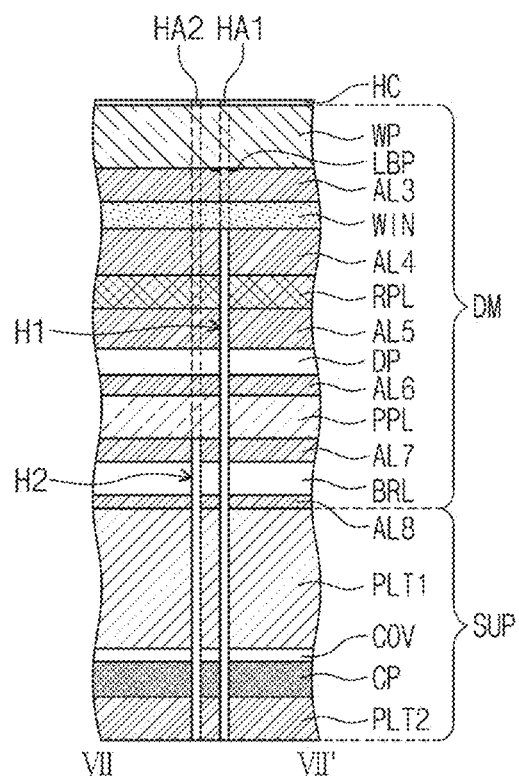
FIG. 15 is a cross-sectional view of line VII-VII' shown in FIG. 10.

FIG. 15 is a cross-sectional view of line VII-VII' shown in FIG. 10.

Referring to FIGS. 10 and 15, in the support portion SUP and the display module DM, the first hole H1 and the second holes H2 overlapping the first and second hole regions HA1 and HA2 may be defined. Around the first hole region HA1, a light blocking pattern LBP may be disposed. The light blocking pattern LBP may be disposed in the same layer as the print layer PIT. The light blocking pattern LBP may be disposed on a lower surface of the window protection layer WP.

The first hole H1 may be defined from the second support plate PLT2 to the fourth adhesive layer AL4. In an embodiment, the first hole H1 may be defined in the second support plate PLT2, the step compensation layer CP, the cover layer COV, the first support plate PLT1, the barrier layer BRL, the panel protection layer PPL, the display panel DP, the reflection prevention layer RPL, and the fourth to eighth adhesive layers AL4 to AL8, for example.

The second hole H2 may be defined from the second support plate PLT2 to the seventh adhesive layer AL7. In an embodiment, the second hole H2 may be defined in the second support plate PLT2, the step compensation layer CP, the cover layer COV, the first support plate PLT1, the barrier layer BRL, and the seventh to eighth adhesive layers AL7 to AL8. In the first hole H1, the above-described camera CM may be disposed, for example. In the second hole H2, the above-described sensor SN may be disposed.

Figure 16:
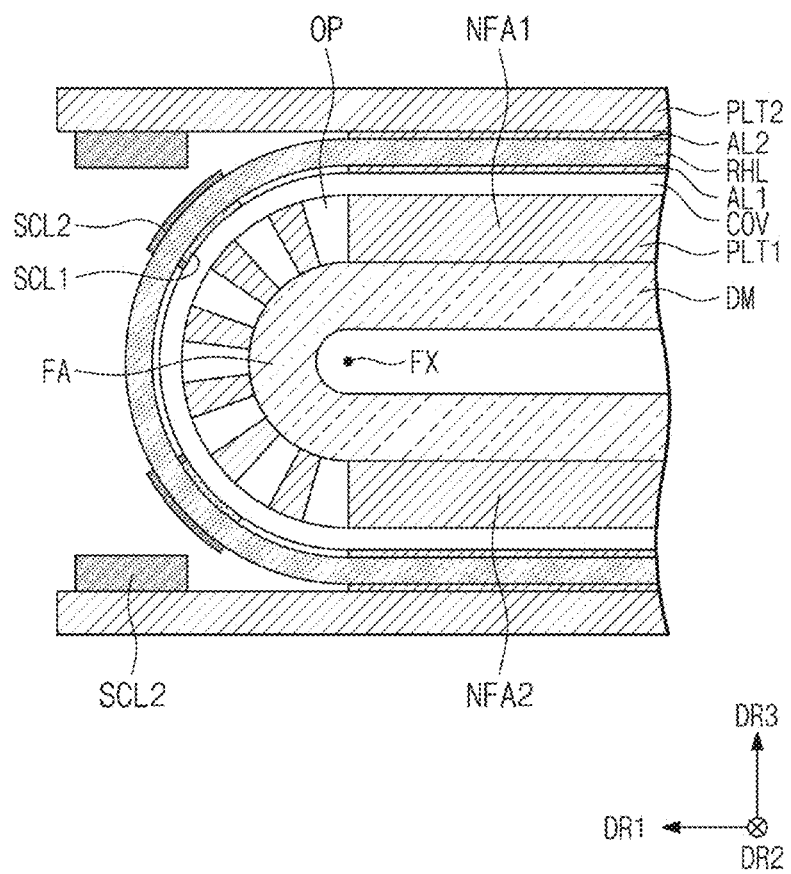
FIG. 16 is a view illustrating the display device shown in FIG. 11 in an in-folded state as an example.

FIG. 16 is a view illustrating the display device shown in FIG. 11 in an in-folded state as an example.

In an embodiment, the detailed components of the display module DM are not shown in FIG. 16.

Referring to FIG. 16, the display device DD may be in-folded around the folding axis FX. The folding region FA may be bent, so that the first non-folding region NFA1 and the second non-folding region NFA2 may face each other. The display device DD may be changed from the first state of being flat shown in FIG. 5 to the second state of being folded shown in FIG. 14, or may be changed from the second state to the first state. The folding operation may be repeatedly performed.

Since the display module DM is a flexible display module, the folding region FA of the display module DM may be easily bent. During the folding operation, the portion of the first support plate PLT1 overlapping the folding region FA may easily be bent by the openings OP defined in the first support plate PLT1.

Referring to FIGS. 11 and 16, the bending portion BAP of the heat dissipation layer RHL may be unfolded in a curved shape having a predetermined curvature when the display module DM and the support portion SUP are folded. When the bending portion BAP is not formed or provided in the heat dissipation layer RHL, when the folding region FA is folded, the heat dissipation layer RHL may be damaged due to a large tensile force generated in a portion of the heat dissipation layer RHL overlapping the folding region FA.

However, in the embodiment of the invention, when the display module DM and the support portion SUP are in an unfolded state, the bending portion BAP of the heat dissipation layer RHL is already bent, and when the display module DM and the support portion SUP are folded, the bent bending portion BAP may be unfolded in a curved shape. Therefore, when the folding region FA is folded, the tensile force generated in the portion of the heat dissipation layer RHL overlapping the folding region FA is reduced, so that the damage of the heat dissipation layer RHL may be prevented.

Figure 17:
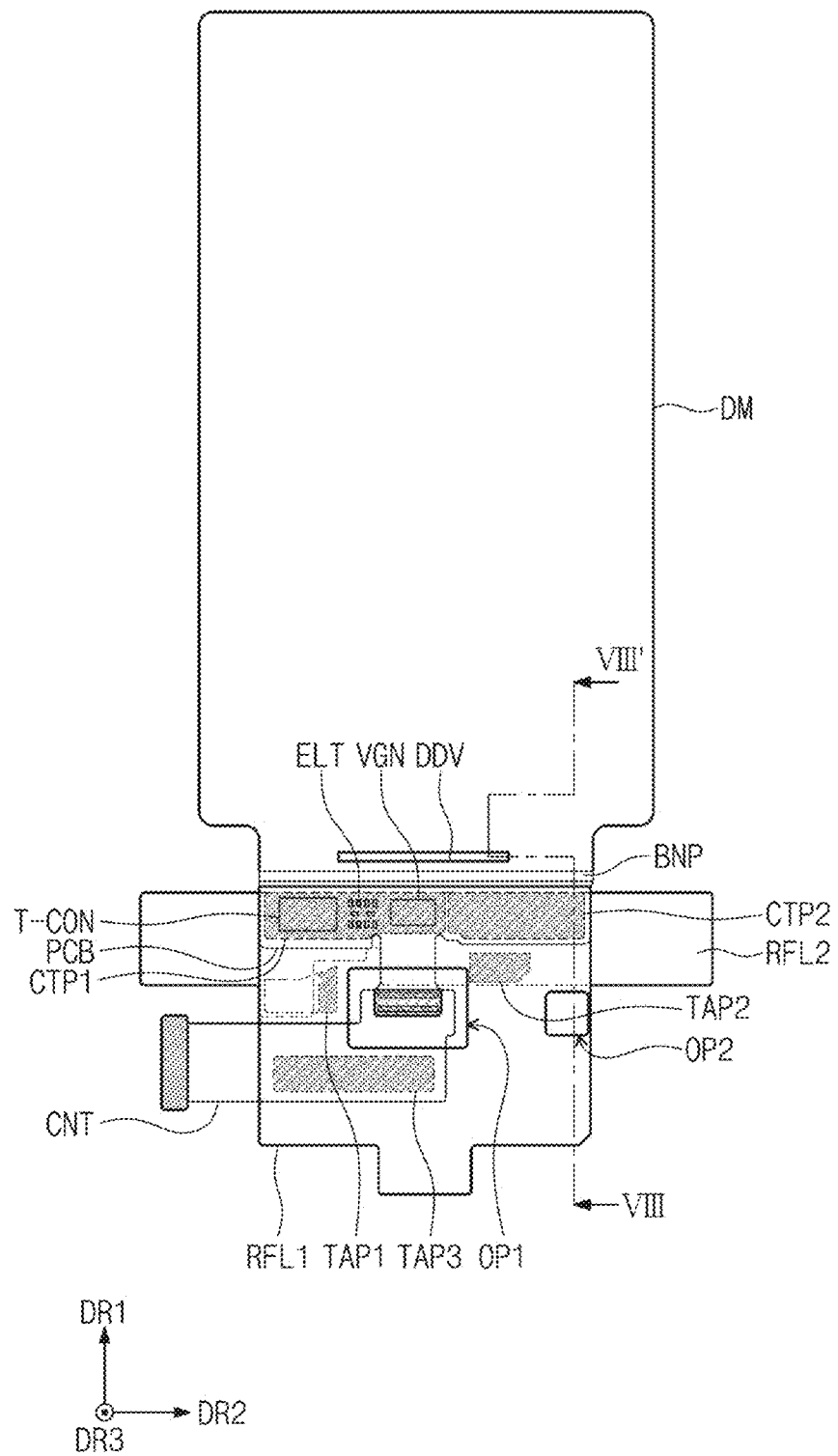
FIG. 17 is a plan view illustrating a printed circuit board connected to a front surface of a display module, and first and second release films covering the printed circuit board.
Figure 18:
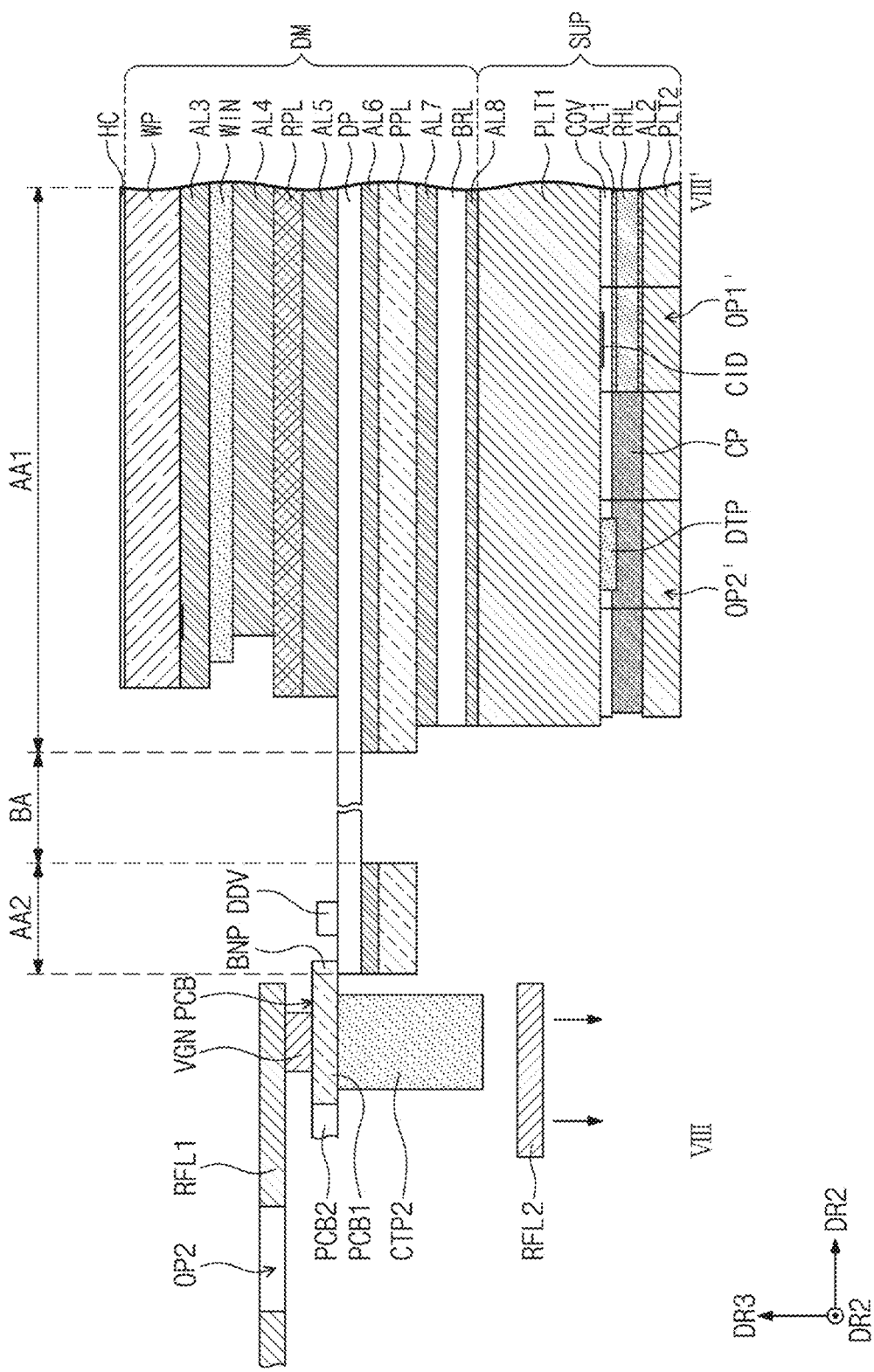
FIG. 18 is a cross-sectional view of line VIII-VIII' shown in FIG. 17.

FIG. 17 is a plan view illustrating a printed circuit board connected to a front surface of a display module, and first and second release films covering the printed circuit board. FIG. 18 is a cross-sectional view of line VIII-VIII' shown in FIG. 17.

In FIG. 18, as an example, cross-sections of portions of the first release film RFL1 and the second release film RFL2, portions of the printed circuit board PCB, the second adhesive TAP2, and the voltage generator VGN are shown, and other components are omitted.

Referring to FIGS. 17 and 18, the panel protection layer PPL and the sixth adhesive layer AL6 may not be disposed below the bending region BA. The data driver DDV may be disposed on the second region AA2 of the display panel DP.

The printed circuit board PCB may be connected to the display module DM. The bonding portion BNP may be connected to one side of the second region AA2. The second conductive adhesive CTP2 may be disposed below the printed circuit board PCB. The second release film RFL2 may be removed from the printed circuit board PCB. The second release film RFL2 may be removed from the second conductive adhesive CTP2.

On a lower surface of the first support plate PLT1, a cell identity ("ID") layer CID may be disposed. The cell ID layer CID may be defined as a product unique number. The first opening OP1' may be defined in each of the second support plate PLT2, the heat dissipation layer RHL, the cover layer COV, the first adhesive layer AL1, and the second adhesive layer AL2. The cell ID layer CID may be exposed to the outside through the first opening OP1'.

Figure 19:
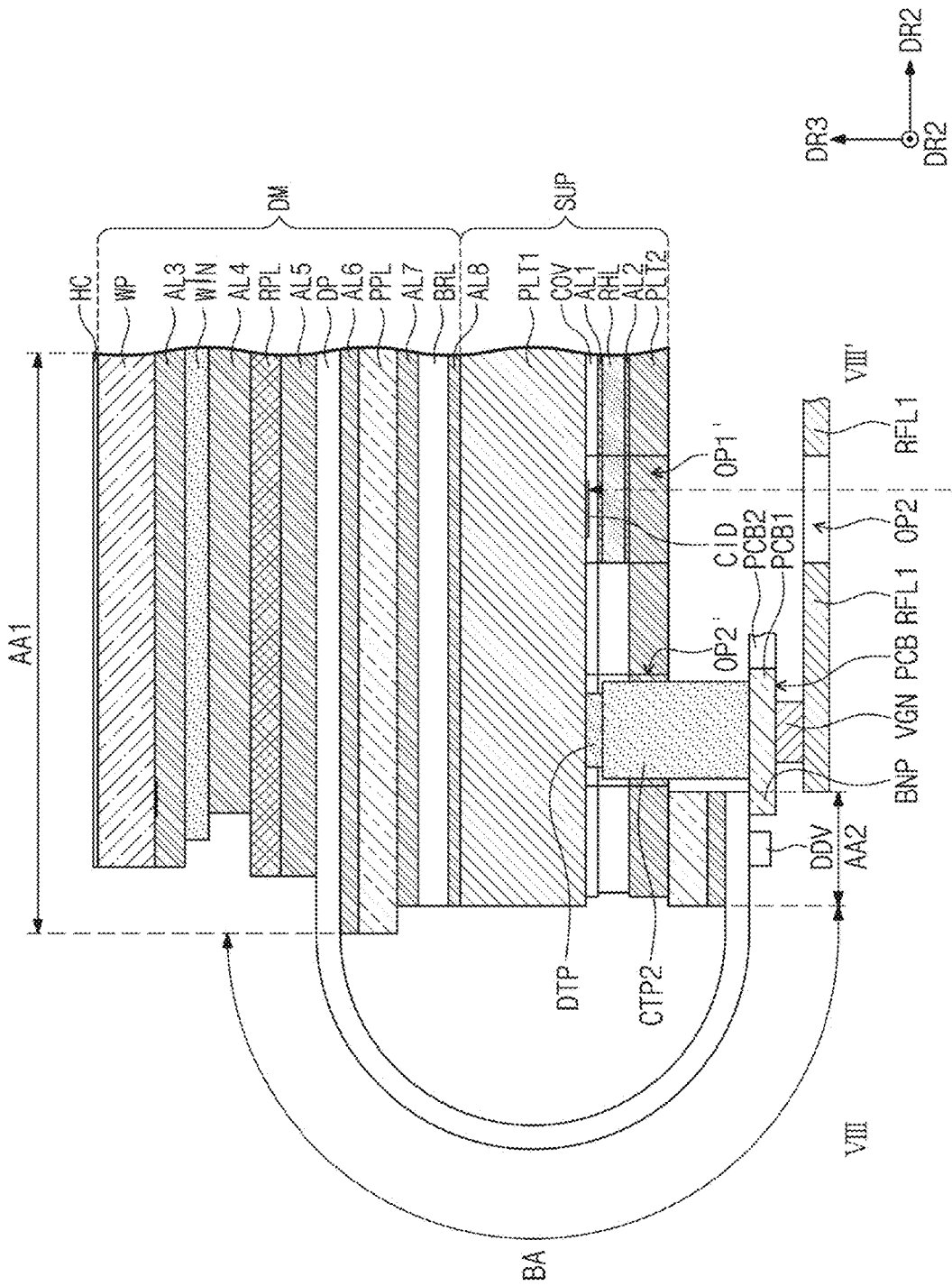
FIG. 19 is a view illustrating a bending region shown in FIG. 18 in a bent state.
Figure 20:
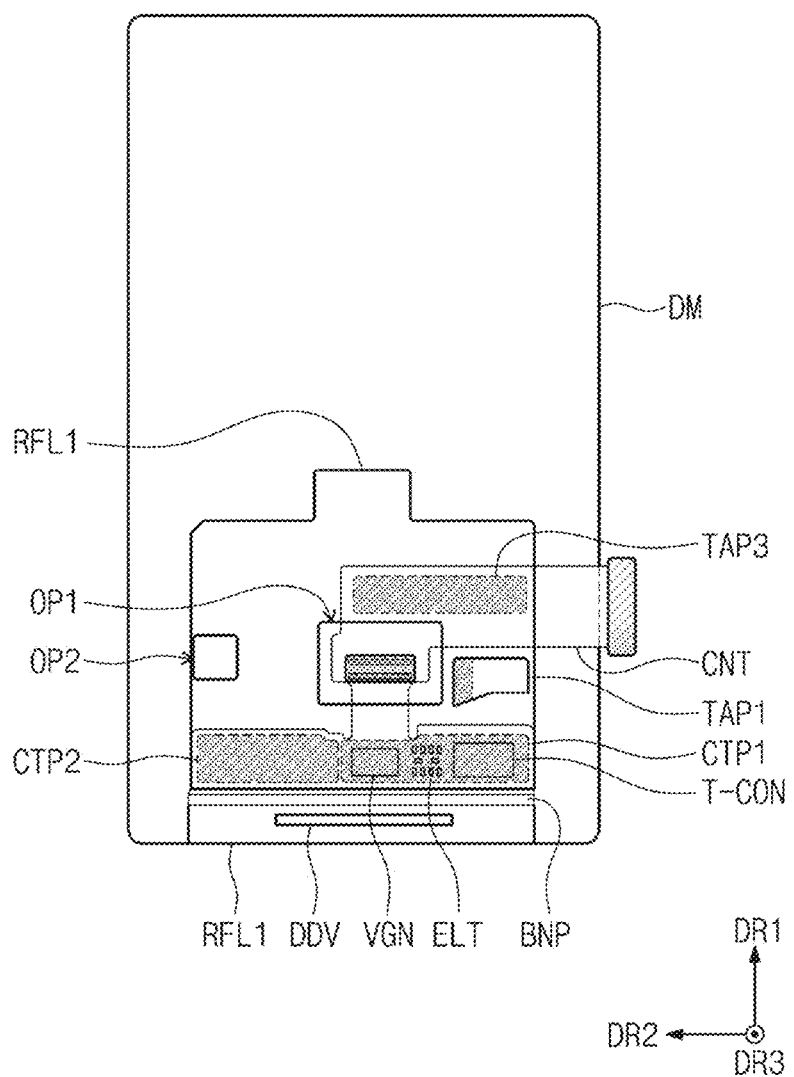
FIG. 20 is a plan view illustrating a printed circuit board connected to a rear surface of a display module, and a first release film disposed on the printed circuit board.

FIG. 19 is a view illustrating a bending region shown in FIG. 18 in a bent state. FIG. 20 is a plan view illustrating a printed circuit board connected to a rear surface of a display module, and a first release film disposed on the printed circuit board.

Referring to FIGS. 19 and 20, the bending region BA is bent, so that the second region AA2 may be disposed below the first region AA1. Therefore, the data driver DDV, the printed circuit board PCB, the voltage generator VGN, the second conductive adhesive CTP2, and the first release film RFL1 may be disposed below the first region AA1. Although not shown, the timing controller T-CON and the first conductive adhesive CTP1 may also be disposed below the first region AA1. Based on FIG. 19, the first release film RFL1 may be disposed below the printed circuit board PCB and the connector CNT.

The data driver DDV, the printed circuit board PCB, the voltage generator VGN, the timing controller T-CON, and the first and second conductive adhesives CTP1 and CTP2 may be disposed below the second support plate PLT2.

The second opening OP2' may be defined in the second support plate PLT2, the step compensation layer CP, and the cover layer COV. The second conductive adhesive CTP2 may be inserted into the second opening OPT to be attached to the first support plate PLT1. The second conductive adhesive CTP2 is attached to the first support plate PLT1, so that the printed circuit board PCB may be fixed to the support portion SUP. The second conductive adhesive CTP2 may be pressed towards the first support plate PLT1 to be attached to the first support plate PLT1.

Although not shown, the first conductive adhesive CTP1 may also be disposed in the second opening OP2'. However, the first conductive adhesive CTP1 may not be attached to the first support plate PLT1.

Referring to FIG. 6, the timing controller T-CON, the voltage generator VGN, and the elements ELT may be disposed on the first conductive adhesive CTP1. When the first conductive adhesive CTP1 is pressed towards the first support plate PLT1 to form the first conductive adhesive CTP1 as a double-sided adhesive (e.g., double-sided tape), and to attach the first conductive adhesive CTP1 to the first support plate PLT1, the timing controller T-CON, the voltage generator VGN, and the elements ELT may be damaged due to pressure. Accordingly, the first conductive adhesive CTP1 may be formed or provided as a single-sided adhesive (e.g., single-sided tape), and may not be attached to the first support plate PLT1 but only be disposed in the second opening OP2'.

In FIG. 6, the second conductive adhesive CTP2 on which the timing controller T-CON, the voltage generator VGN, and the elements ELT are not disposed may be pressed towards the first support plate PLT1 in FIG. 19, and attached to the first support plate PLT1.

A dummy adhesive (e.g., dummy tape) DTP may be disposed between the first support plate PLT1 and the second conductive adhesive CTP2. The second conductive adhesive CTP2 may be attached to the first support plate PLT1 through the dummy adhesive DTP.

The dummy adhesive DTP may include a single-sided adhesive (e.g., single-sided tape). In an embodiment, an adhesive may be disposed on an upper surface of the dummy adhesive DTP facing the first support plate PLT1, and an adhesive may not be disposed on a lower surface of the dummy adhesive DTP facing the second conductive adhesive CTP2, for example. The upper surface of the dummy adhesive DTP may be attached to the lower surface of the first support plate PLT1, and one surface of the second conductive adhesive CTP2 facing the dummy adhesive DTP may be attached to the lower surface of the dummy adhesive DTP.

The connector CNT may be connected to an external test device. The test device may provide test signals to the printed circuit board PCB via the connector. The test signals may be provided to the display module DM through the printed circuit board PCB. Whether the display module DM works without failure may be determined through the test signals.

The second opening OP2 defined in the first release film RFL1 may overlap the first opening OP1'. After the printed circuit board PCB is attached to the support portion SUP, the display module DM, the support portion SUP, and the printed circuit board PCB may be moved to a next process without the connector CNT and the first release film RFL1 being removed. An operator may check the product unique number through the second opening OP2 and the first opening OP1' during the process.

In the next process, the first release film RFL1 and the connector CNT used only for testing may be removed from the printed circuit board PCB. Thereafter, the display module DM, the support portion SUP, and the printed circuit board PCB may be accommodated in a set structure (or housing).

In an embodiment of the invention, a first release film is disposed on a front surface of a printed circuit board, a second release film is disposed below a rear surface of the printed circuit board, and the first release film and the second release film may be fixed to each other through a first adhesive and a second adhesive disposed around the printed circuit board. Accordingly, the first release film and the second release film are not separated from each other and are more stably bonded together, and the printed circuit board may thus be more safely transferred and connected to a display module.

Although the invention has been described with reference to embodiments of the invention, it will be understood that various changes and modifications may be made by those skilled in the art without departing from the spirit and scope of the invention. In addition, the embodiments disclosed in the description are not intended to limit the technical spirit of the invention, and the scope of the invention is not to be limited by the above embodiments but by the claims and the equivalents thereof.

What is claimed is:

1. A release film on a printed circuit board and a connector connected to the printed circuit board, the release film comprising:
   a first release film disposed on a first surface of the printed circuit board and a surface of the connector;
   a second release film disposed on a second surface of the printed circuit board opposite to the first surface of the printed circuit board; and
   a first adhesive attached to a portion of a surface of the first release film which does not overlap the second release film, the first adhesive comprising:
      a base film disposed on the surface of the first release film facing the printed circuit board; and
      a double-sided adhesive disposed between the first release film and the base film,
   wherein the base film extends in a direction parallel to an extension direction of the first release film, and
   the base film covers a portion of a surface of the second release film which does not directly face the first release film.

2. The release film of claim 1, wherein the first adhesive is not attached to the second release film.

3. The release film of claim 1, wherein when the second release film is removed from the printed circuit board, the first adhesive is not removed.

4. The release film of claim 1, wherein the printed circuit board comprises:
   a first substrate portion extending in a second direction in a plan view defined by a first direction and the second direction crossing each other;
   a second substrate portion extending in the first direction from a portion of the first substrate portion; and
   a connection portion connected to one side of the second substrate portion facing the first direction,
   the second release film being disposed underneath the first substrate portion and the second substrate portion.

5. The release film of claim 4, wherein the second release film does not overlap the connection portion.

6. The release film of claim 4, wherein the second release film extends farther outside than the first release film in the second direction.

7. The release film of claim 4, wherein the connector comprises:
   a flexible circuit film;
   a first connection portion connected to a first side of the flexible circuit film and connected to the connection portion; and
   a second connection portion connected to a second side of the flexible circuit film opposite to the first side of the flexible circuit film,
   the connection portion and the first connection portion are exposed through a first opening defined in the first release film.

8. The release film of claim 7, wherein the second connection portion is disposed farther outside than the first release film and the second release film.

9. The release film of claim 7, further comprising a third adhesive disposed between the flexible circuit film and the first release film.

10. The release film of claim 7, wherein:
    a second opening is defined in the first release film;
    the second opening does not overlap the second release film; and
    the first opening is disposed between the second opening and the first adhesive.

11. The release film of claim 10, wherein when the second release film is removed and the printed circuit board is disposed on a first surface of a first support plate facing the printed circuit board and opposite to a second surface of the first support plate facing a display module, a cell identity layer disposed on the second surface of the first support plate is exposed through the second opening.

12. The release film of claim 4, wherein:
    a first conductive adhesive and a second conductive adhesive arranged in the second direction are disposed underneath the first substrate portion; and
    the second release film covers the first conductive adhesive and the second conductive adhesive below the first substrate portion.

13. The release film of claim 12, wherein:
    the first conductive adhesive is attached to the first substrate portion and is not attached to the second release film; and
    the second conductive adhesive is attached to the first substrate portion and the second release film.

14. The release film of claim 12, further comprising a second adhesive adjacent to the second conductive adhesive in the first direction, and disposed between the first release film and the second release film.

15. The release film of claim 14, wherein when the second release film is removed from the printed circuit board, the second adhesive is removed along with the second release film.

16. The release film of claim 14, wherein:
the first adhesive is adjacent to the first conductive adhesive in the first direction; and
the second substrate portion is disposed between the first adhesive and the second adhesive in the second direction.

17. The release film of claim 12, wherein:
components are disposed on the first substrate portion which overlaps the first conductive adhesive; and
the first release film is disposed on the components.

18. The release film of claim 1, wherein the first release film and the second release film do not overlap a bonding portion of the printed circuit board to be bonded to a display panel.

19. A release film disposed on a printed circuit board and a connector connected to the printed circuit board, the release film comprising:
a first release film disposed on a first surface of the printed circuit board and a surface of the connector, and defining a first opening and a second opening adjacent to the first opening;
a second release film disposed below the printed circuit board; and
a first adhesive attached to a portion of the first release film which does not overlap the second release film, the first adhesive comprising:
a base film disposed on the surface of the first release film facing the printed circuit board; and
a double-sided adhesive disposed between the first release film and the base film,
wherein the first opening exposes a connection portion of the printed circuit board and a first connection portion of the connector connected to the connection portion,
the base film extends in a direction parallel to an extension direction of the first release film, and
the base film covers a portion of a surface of the second release film which does not directly face the first release film.

20. The release film of claim 19, wherein the first adhesive is not attached to the second release film, and when the second release film is removed from the printed circuit board, the first adhesive is not removed.

21. A release film disposed on a printed circuit board connected to a display module, the release film comprising:
a first release film disposed on a first surface of the printed circuit board and a first surface of a connector connected to the printed circuit board, and the first release film defining a first opening and a second opening adjacent to the first opening; and
a first adhesive attached to a portion of the first release film, the first adhesive including:
a double-sided adhesive attached to the portion of the first release film; and
a base film attached to one side of the double-sided adhesive which does not face the first release film,
wherein the first opening exposes a connection portion of the printed circuit board and a first connection portion of the connector connected to the connection portion.

* * * * *